US009103872B2

(12) United States Patent
Chung

(10) Patent No.: US 9,103,872 B2
(45) Date of Patent: Aug. 11, 2015

(54) HIGHLY ADAPTIVE THERMAL PROPERTIES MEASUREMENT SYSTEM AND MEASURING METHOD THEREOF

(71) Applicant: National Central University, Jhongli, Taoyuan County (TW)

(72) Inventor: Te-Yuan Chung, Pingtung County (TW)

(73) Assignee: NATIONAL CENTRAL UNIVERSITY, Jhongli, Taoyuan County (TW)

( * ) Notice: Subject to any disclaimer, the term of this patent is extended or adjusted under 35 U.S.C. 154(b) by 389 days.

(21) Appl. No.: 13/667,991

(22) Filed: Nov. 2, 2012

(65) Prior Publication Data
US 2013/0136151 A1   May 30, 2013

(30) Foreign Application Priority Data

Nov. 24, 2011 (TW) .............................. 100143105 A

(51) Int. Cl.
G01N 25/20 (2006.01)
G01K 1/16 (2006.01)
G01J 5/00 (2006.01)
G01R 31/26 (2014.01)

(52) U.S. Cl.
CPC ........ *G01R 31/2642* (2013.01); *G01R 31/2635* (2013.01)

(58) Field of Classification Search
USPC ............................... 374/43, 44, 120, 130, 124
See application file for complete search history.

(56) References Cited

U.S. PATENT DOCUMENTS

| 3,808,430 | A | * | 4/1974 | Frungel | 250/204 |
|---|---|---|---|---|---|
| 4,576,432 | A | * | 3/1986 | Ruger | 374/124 |
| 4,854,724 | A | * | 8/1989 | Adams et al. | 374/5 |
| 4,965,451 | A | * | 10/1990 | Solter | 250/330 |
| 5,219,226 | A | * | 6/1993 | James | 374/124 |
| 5,803,606 | A | * | 9/1998 | Petry et al. | 374/45 |
| 5,971,608 | A | * | 10/1999 | Koizumi | 374/5 |
| 6,074,087 | A | * | 6/2000 | Chen et al. | 374/129 |
| 6,146,014 | A | * | 11/2000 | Bruce et al. | 374/161 |
| 6,168,311 | B1 | * | 1/2001 | Xiao et al. | 374/161 |
| 7,409,313 | B2 | * | 8/2008 | Ringermacher et al. | 702/172 |
| 8,055,054 | B2 | * | 11/2011 | Ringermacher et al. | 382/141 |
| 8,167,483 | B2 | * | 5/2012 | Jensen | 374/120 |
| 2008/0361709 | | * | 9/1998 | Petry et al. | 374/45 |
| 2002/0018510 | A1 | * | 2/2002 | Murphy et al. | 374/161 |
| 2005/0259716 | A1 | * | 11/2005 | Ito et al. | 374/161 |
| 2006/0153269 | A1 | * | 7/2006 | Lakestani et al. | 374/43 |

(Continued)

*Primary Examiner* — Mirellys Jagan
(74) *Attorney, Agent, or Firm* — Muncy, Geissler, Olds & Lowe, P.C.

(57) ABSTRACT

A highly adaptive thermal properties measurement system and measuring method thereof, for measuring various thermal property values of a device under test without actually lighting up the device under test, are disclosed. The measurement system includes a light source unit, a light modulation module, a holding unit, a thermal reflection unit, a thermal signal capture unit, and a control and computation unit. A light field provided from the light source unit is first modulated by the light modulation module for its distribution of intensity, and then illuminates on the device under test such that the device under test is heated in a specific mode so as to simulate a temperature distribution of the device under test in a state of continuous operation. Further, the control and computation unit computes various thermal property values of the device under test based on a top-surface thermal signal and a bottom-surface thermal signal captured by the thermal signal capture unit.

28 Claims, 12 Drawing Sheets

(56) References Cited

U.S. PATENT DOCUMENTS

| | | |
|---|---|---|
| 2007/0036199 A1* | 2/2007 | Ouyang et al. ............... 374/120 |
| 2007/0220784 A1* | 9/2007 | Li ................................ 38/77.8 |
| 2011/0038392 A1* | 2/2011 | Ando et al. .................... 374/16 |
| 2013/0148689 A1* | 6/2013 | Yahaba et al. .................. 374/5 |
| 2013/0343425 A1* | 12/2013 | Tas et al. ...................... 374/121 |
| 2015/0063413 A1* | 3/2015 | Kubota et al. ................ 374/121 |

* cited by examiner

HIGHLY ADAPTIVE THERMAL PROPERTIES MEASUREMENT SYSTEM AND MEASURING METHOD THEREOF

BACKGROUND OF THE INVENTION

1. Field of the Invention

The present invention relates to a highly adaptive thermal properties measurement system and measuring method thereof, and more particularly, to a highly adaptive thermal properties measurement system and measuring method thereof where under the situation that without actually lighting up a device under test or applying any electric power to the device under test, the device under test can be promptly measured for its various thermal property values.

2. Description of Related Art

Referring to FIG. 1, a schematic view illustrating a conventional thermal properties measurement system for a device under test, the measurement system comprises a thermostatic control unit 11, a real-time signal capture unit 12, a data processing unit 13, and an optical output power capture 14. A device under test 15 (such as a light emitting diode unit, LED unit) is disposed in the optical output power capture 14, where the optical output power capture 14 is coupled with the thermostatic control unit 11 so as to maintain constant a shell temperature (Tc) of the device under test 15 during a thermal property measurement. Besides, in order to capture synchronously a forward voltage drop, shell temperature and optical output power of the device under test 15, the real-time signal capture unit 12 includes a voltage capture 121, a temperature capture 122, and a synchronizer 123.

However, when the conventional thermal properties measurement system proceeds with a measurement, the device under test 15 needs to be applied with a drive voltage, so that by a measure of actually lighting up the device under test 15 (such as an LED unit), the device under test 15 can be maintained in a state of continuous operation. At this moment, values of the forward voltage drop and optical output power of the device under test 15 at various shell temperatures can be captured synchronously. As a result, the conventional thermal properties measurement system not only requires consuming electric power on driving the lighting of the device under test 15, but also makes related circuits of the device under test 15 deteriorated. This will sacrifice life of use for the device under test 15 which can hardly be offered to customers after measurement.

Therefore, this industry requires a highly adaptive thermal properties measurement system and measuring method thereof for promptly measuring various thermal property values of a device under test without lighting up the device under test or applying any electric power to the device under test.

SUMMARY OF THE INVENTION

An object of the present invention is to provide a highly adaptive thermal properties measurement system for promptly measuring various thermal property values of a device under test without actually lighting up the device under test nor applying any electric power to the device under test.

Another object of the present invention is to provide a highly adaptive thermal properties measuring method for promptly measuring various thermal property values of a device under test without actually lighting up the device under test nor applying any electric power to the device under test.

To achieve the above objects, the highly adaptive thermal properties measurement system, according to the present invention, is provided for measuring plural thermal property values of a device under test having a top surface and a bottom surface, and comprises a light source unit for supplying high intensity light field, a light modulation module for modulating distribution of intensity of the light field, a holding unit for holding the device under test, a thermal reflection unit arranged toward the device under test, a thermal signal capture unit for capturing a thermal signal of the top surface and a thermal signal of the bottom surface respectively, and a control and computation unit for coupling with the light source unit and the thermal signal capture unit. The light field irradiates from the light source unit, passes through the light modulation unit and illuminates on the device under test so as to heat the device by the illumination pattern. The thermal reflection unit is arranged for imaging the top-surface thermal signal on an imaging position, and wherein the thermal signal capture unit captures the top-surface thermal signal on the imaging position, and also captures the bottom-surface thermal signal. Then the control and computation unit computes thermal property values of the device under test based on the top-surface thermal signal and the bottom-surface thermal signal.

Further, to achieve the above objects, the highly adaptive thermal properties measurement system, according to the present invention, is provided for measuring plural thermal property values of a device under test having a top surface and a bottom surface, and comprises a light source unit for supplying high intensity light field, a light modulation module for modulating distribution of intensity of the light field, a holding unit for holding the device under test, a first thermal signal capture unit is arranged toward the device under test for capturing a thermal signal of the bottom surface, a second thermal signal capture unit is arranged at one side of the holding unit opposite to the first thermal signal capture unit so as to capture a thermal signal of the top surface of the device under test, and a control and computation unit for coupling with the light source unit, the first thermal signal capture unit, and the second thermal signal capture unit. The light field irradiates from the light source unit, passes through the light modulation unit and illuminates on the device under test so as to heat the device under test by the illumination pattern. Then the control and computation unit computes thermal property values of the device under test based on the top-surface thermal signal and the bottom-surface thermal signal.

Still further, to achieve the above objects, a method for measuring the highly adaptive thermal properties, according to the present invention, is provided for measuring plural thermal property values of a device under test having a top surface and a bottom surface. The method comprises the following steps: (A) Providing a highly adaptive thermal properties measurement system, comprising a light source unit, a light modulation module, a holding unit, a thermal reflection unit, a thermal signal capture unit, and a control and computation unit, wherein the control and computation unit is coupled with the light source unit and the thermal signal capture unit, respectively; (B) Holding the device under test on the holding unit; (C) Controlling the light source unit to irradiate high intensity light field, where the light field passes through the light modulation module and illuminates on the device under test so as to heat the device under test by the illumination pattern; (D) Controlling the thermal signal capture unit to capture a top-surface thermal signal and a bottom-surface thermal signal of the device under test, wherein the thermal reflection unit is arranged for imaging the top-surface thermal signal on an imaging position, and wherein the thermal signal capture unit captures the top-surface thermal signal on the imaging position, and also captures the bottom-surface thermal signal; and (E) Computing thermal property values of the device under test based on the top-surface thermal signal and the bottom-surface thermal signal. In the highly adaptive thermal properties measurement system, the light modulation module is used to modulate the distribution of intensity of the light field, and that the thermal reflection unit is arranged toward the device under test.

Therefore, the highly adaptive thermal properties measurement system, according to the present invention, uses a light field, which has a specific distribution of intensity after modulation, to illuminate on the device under test so as to heat the device under test by the illumination pattern, and to simulate a temperature distribution of the device under test in a state of continuous operation. Besides, through the thermal signal capture unit, the thermal signal of the top surface and the thermal signal of the bottom surface of the device under test can be captured. As such, the thermal properties measurement system, according to the present invention, does not need to actually light up the device under test nor to apply any electric power to the device under test (as the measurement manner adopted in the conventional thermal properties measurement system), the device under test can be promptly measured for its various thermal property values, such as thermal resistance, heat capacity, thermal diffusion parameters, and so forth.

On the other hand, the method for measuring highly adaptive thermal properties, according to the present invention, first provides a highly adaptive thermal properties measurement system according to the present invention, applies the highly adaptive thermal properties measurement system to measure various thermal property values of a device under test. As such, the method for measuring highly adaptive thermal properties, according to the present invention, does not need to actually light up the device under test nor to apply any electric power to the device under test (as the measurement manner adopted in the conventional thermal properties measurement system), the device under test can be promptly measured for its various thermal property values, such as thermal resistance, heat capacity, and thermal diffusion parameters, and so forth.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
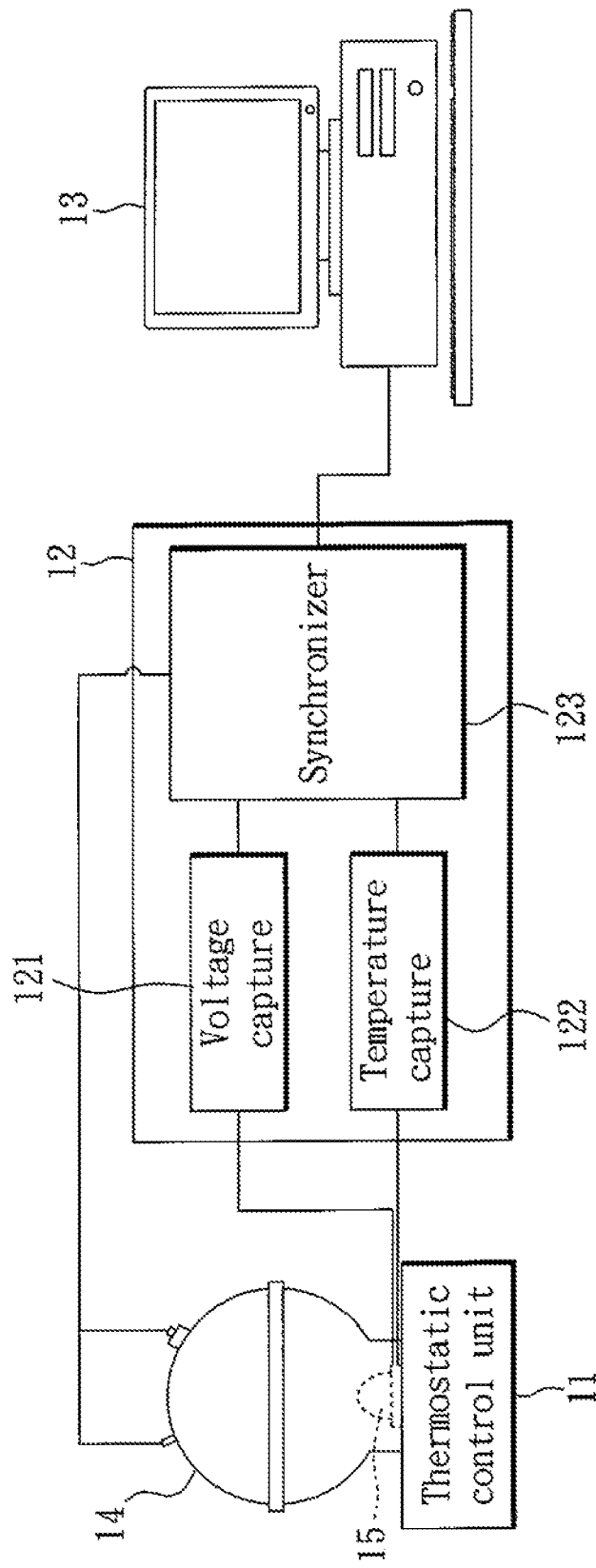
FIG. 1 is a schematic view illustrating a conventional thermal properties measurement system for a device under test.
Figure 2A:
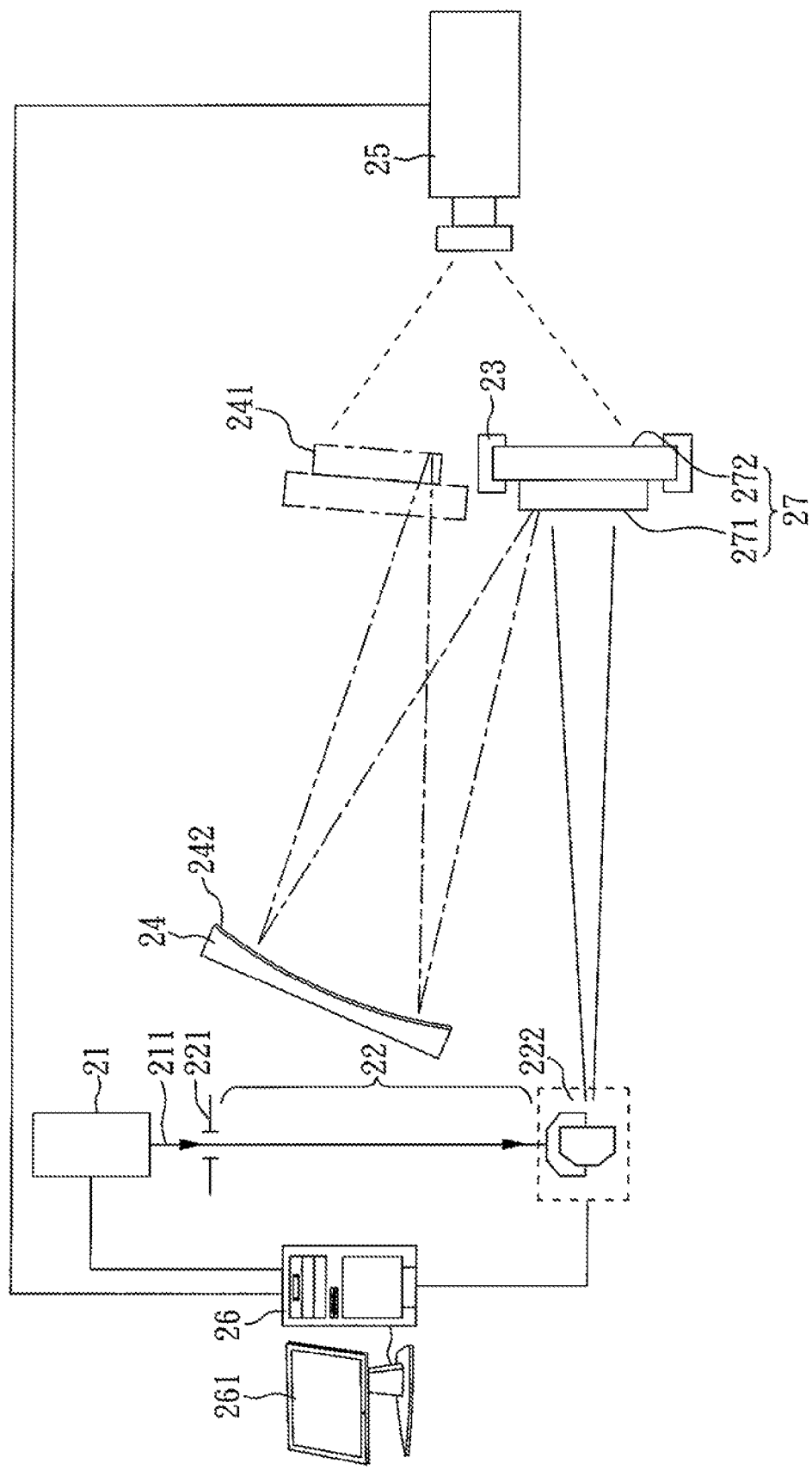
FIG. 2A is a schematic view illustrating a highly adaptive thermal properties measurement system according to a first embodiment of the present invention.

Referring to FIG. 2A, a schematic view illustrating a highly adaptive thermal properties measurement system according to a first embodiment of the present invention, the measurement system comprises a light source unit 21, a light modulation module 22, a holding unit 23, a thermal reflection unit 24, a thermal signal capture unit 25, and a control and computation unit 26. Further, the highly adaptive thermal properties measurement system, according to the first embodiment of the present invention, is provided for measuring plural thermal property values of a device under test 27 having a top surface 271 and a bottom surface 272. Still further, the control and computation unit 26 is coupled with the light source unit 21 and the thermal signal capture unit 25, respectively, so as to control operation of the light source unit 21 and the thermal signal capture unit 25 during a measurement process.

According to the present embodiment, the device under test 27 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 21 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave (CW) or pulse so long as making the device under test produce a measurable temperature variation.

In the present embodiment, the light source unit 21 is used to provide a light field 211. Besides, the light modulation module 22 is used to modulate the distribution of intensity of the light field 211, such as a spatial modulation or a temporal modulation. As shown in 2A, the light modulation module 22 includes a first light modulation unit 221 and a second light modulation unit 222 such that light passes first through the first light modulation unit 221 and then through the second light modulation unit 222.

Further, in the present embodiment, the first light modulation unit 221 relates to an aperture (such as a square aperture) and the second light modulation unit 222 to a galvo scanner, where the first light modulation unit 221 and the second light modulation unit 222 are coupled to the control and computation unit 26 so as to be governed by the same, and to reflect the light field 211 to various positions of the device under test 27. That is to say, in the thermal properties measurement system, according to the present embodiment, the light modulation module 22 serves to modulate the "spatial distribution" of the intensity of the light field 211.

Further, in the thermal properties measurement system, according to the present embodiment, the holding unit 23 is provided for holding the device under test 27, and that the holding unit 23 holds a surface other than the top surface 271 and the bottom surface 272, such as a side surface. In the present embodiment, the holding unit 23 is constituted by general opto-mechanical components, and in order to avoid influencing thermal related behaviors of the device under test 27, such as cooling behavior, the contacting portion that the holding unit 23 contacts the device under test 27 is made of materials of "heat-insulation function," such as insulation foam, so as to prevent thermal energy of the device under test 27 dispersing from the holding unit 23 to the surrounding. On the other hand, the thermal signal capture unit 25 is provided for capturing a thermal signal of the top surface 271 and a thermal signal of the bottom surface 272, as respectively shown in FIG. 2B and FIG. 2C.

Further, as shown in FIG. 2A, the thermal reflection unit 24 is arranged toward the device under test 27 so as to image a thermal signal of the top surface 271 of the device under test 27 on an imaging position 241. In the present embodiment, the thermal reflection unit 24 relates to a concave mirror, and that the concave mirror is coated, on its reflective surface, with a heat reflective film 242. Preferably, the heat reflective film 242 is of a material of gold or silver so as to effectively image the thermal signal of the top surface 271 of the device under test 27 on the imaging position 241. As such, the thermal signal capture unit 25 can capture the thermal signal of the top surface 271 of the device under test 27 from the imaging position 241 (see FIG. 2B), and synchronously, capture the thermal signal of the bottom surface 272 of the device under test 27 (see also FIG. 2C). In the present embodiment, the thermal signal capture unit 25 relates to a thermal camera, a mid-wavelength infrared detector (MWIR detector), or a long-wavelength infrared detector (LWIR detector) so as to capture the thermal signal of the top surface 271, and of the bottom surface 272, of the device under test 27, as respectively shown in FIG. 2B and FIG. 2C.

When the thermal properties measurement system, according to the first embodiment of the present invention, is operated, the device under test 27 is held by the holding unit 23, then the control and computation unit 26 will control the light source unit 21 so as to irradiate a light field 211 (such as a high power laser), thereafter the light field 211 passes through the aperture (acting as the first light modulation unit 221) and the galvo scanner (acting as the second light modulation unit 222) and illuminates on the device under test 27. At this moment, the galvo scanner receives control of the control and computation unit 26 so as to reflect the light field 211, in a pre-determined mode, to various positions at the top surface 271 of the device under test 27, such as positions of multiple LED modules of an LED module sub-mount. Namely, the light field 211 performs a scanning on the device under test 27 in a specific mode (such as progressive scanning), so that the device under test 27 (such as an LED module sub-mount) can be heated under a pre-determined heating mode so as to simulate a temperature distribution of the device under test 27 in a state of continuous operation, such as the state when the multiple LED modules of an LED module sub-mount have run for a certain period of time.

When the temperature distribution of the device under test satisfies a pre-determined temperature distribution, for example temperature of the multiple LED modules has reached to a specific value of temperature, the control and computation unit 26 will compute multiple thermal property values of the device under test 27, such as, but not limited to, thermal resistance, heat capacity, and thermal diffusion parameters, based on the top-surface thermal signal and bottom-surface thermal signal of the device under 27 captured by the thermal signal capture unit 25. Since computation of these thermal property values have been well known to those skilled in the art, description thereto may be redundant.

Figure 2C:
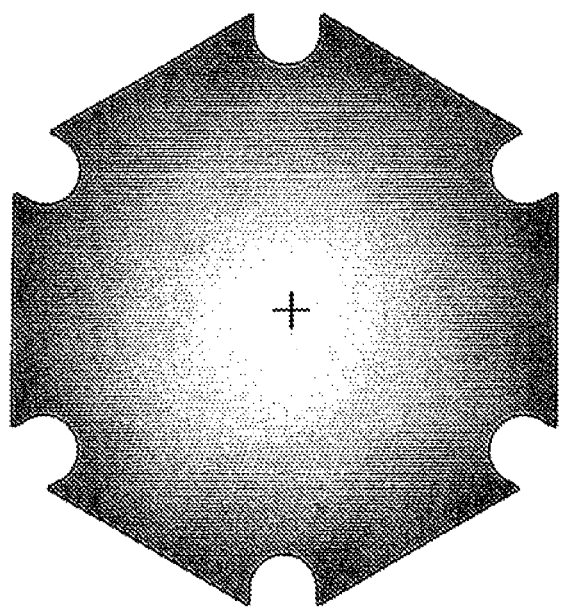
FIG. 2C is a schematic view illustrating the thermal signal of a bottom surface of the device under test captured by the thermal signal capture unit of the highly adaptive thermal properties measurement system according to the first embodiment of the present invention.
Figure 2B:
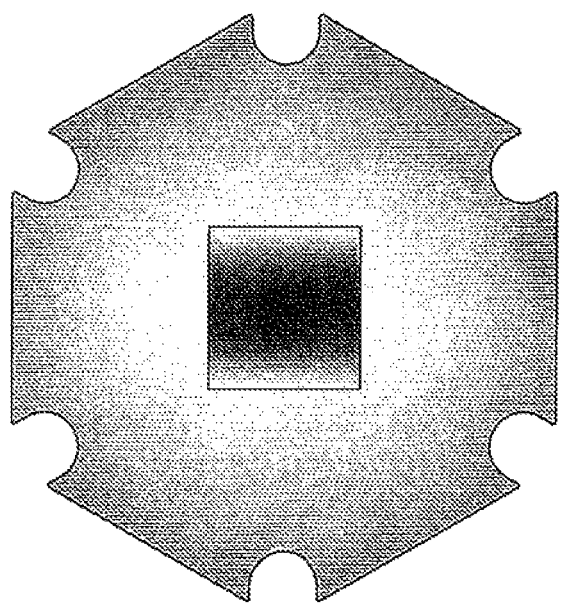
FIG. 2B is a schematic view illustrating the thermal signal of a top surface of a device under test captured by a thermal signal capture unit of the highly adaptive thermal properties measurement system according to the first embodiment of the present invention.

Alternatively, in the thermal properties measurement system, according to the present embodiment, the control and computation unit 26 may relate to a computer including a display unit 261. Further, the control and computation unit 26 computes multiple thermal property values of the device under test 27 based on the top-surface temperature distribution of the device under test 27 corresponding to the top-surface thermal signal (as shown in FIG. 2B) and the bottom-surface temperature distribution of the device under test 27 corresponding to the bottom-surface thermal signal (as shown in FIG. 2C), such as thermal resistance, heat capacity, and thermal diffusion parameters. At this moment, the display unit 261 is employed to display the top-surface thermal signal, the bottom-surface thermal signal, and these thermal property values.

Therefore, the thermal properties measurement system, according to the first embodiment, uses a light field, which has a specific distribution of intensity after modulation, to illuminate on the device under test 27 so as to heat the device under test 27 by the illumination pattern, and to simulate a temperature distribution of the device under test 27 in a state of continuous operation. Besides, through the thermal signal capture unit 25, the thermal signal of the top surface 271 and the thermal signal of the bottom surface 272 of the device under test 27 can be captured. As such, the thermal properties measurement system, according to the first embodiment, does not need to actually light up the device under test 27 (as the measurement manner adopted in the conventional thermal properties measurement system) nor to apply any electric power to the device under test 27, the device under test 27 can be promptly measured for its various thermal property values, such as thermal resistance, heat capacity, and thermal diffusion parameters, and so forth.

Figure 3:
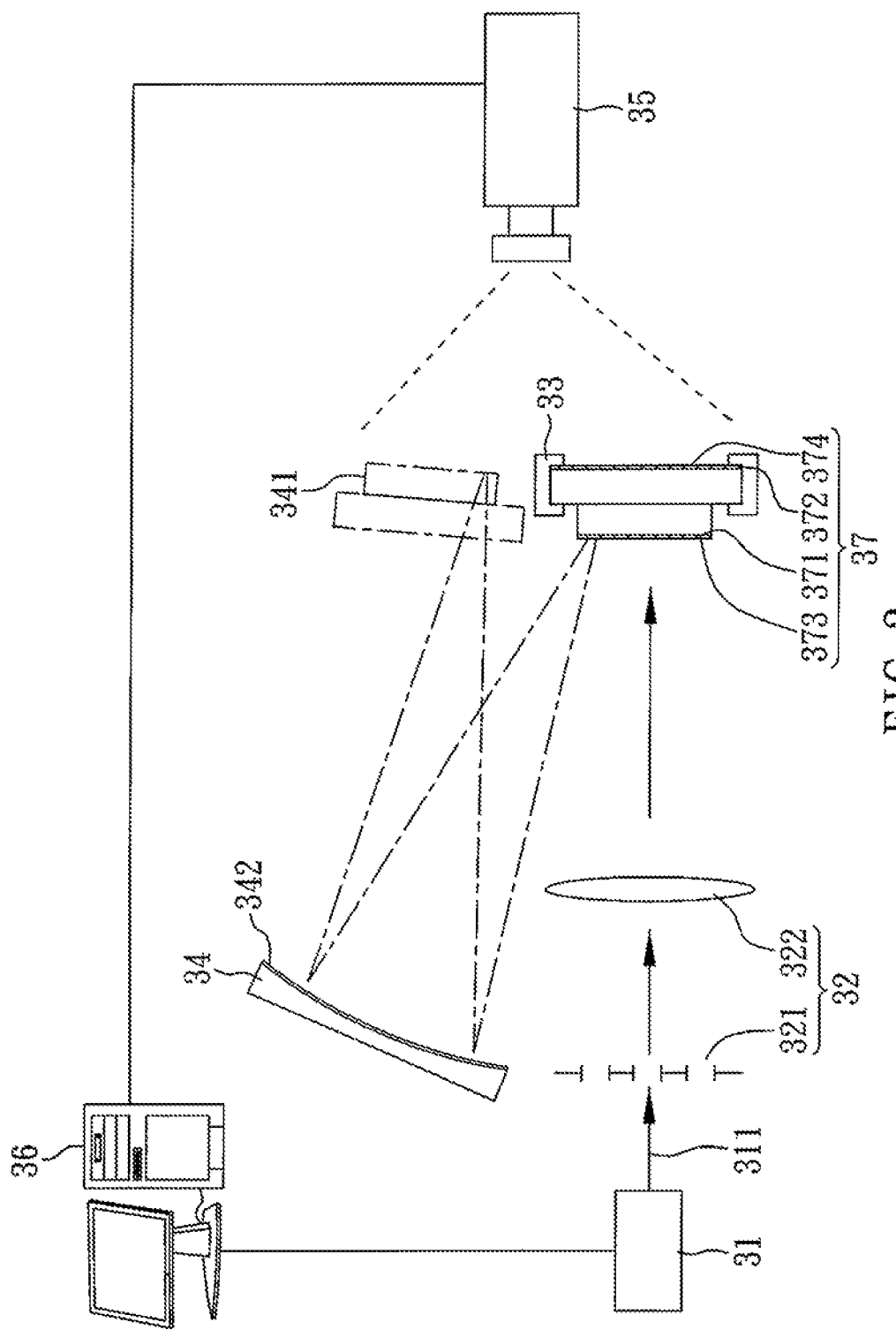
FIG. 3 is a schematic view illustrating a highly adaptive thermal properties measurement system according to a second embodiment of the present invention.

Referring to FIG. 3, a schematic view illustrating a highly adaptive thermal properties measurement system according to a second embodiment of the present invention, the measurement system comprises a light source unit 31, a light modulation module 32, a holding unit 33, a thermal reflection unit 34, a thermal signal capture unit 35, and a control and computation unit 36. Further, the highly adaptive thermal properties measurement system, according to the second embodiment of the present invention, is provided for measuring plural thermal property values of a device under test 37 having a top surface 371 and a bottom surface 372. Still further, the control and computation unit 36 is coupled with the light source unit 31 and the thermal signal capture unit 35, respectively, so as to control operation of the light source unit 31 and the thermal signal capture unit 35 during a measurement process.

According to the present embodiment, the device under test 37 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 31 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave or pulse so long as making the device under test produce a measurable temperature variation.

In the present embodiment, the light source unit 31 is used to provide a light field 311. Besides, the light modulation module 32 is used to modulate a distribution of intensity of the light field 311. The light modulation module 32 includes a first light modulation unit 321 and a second light modulation unit 322 such that light passes first through the first light modulation unit 321 and then through the second light modulation unit 322. The first light modulation unit 321 relates to an aperture and the second light modulation unit 322 to an imaging lens set. Further, the holding unit 33 is provided for holding the device under test 37, and that the holding unit 33 holds a surface other than the top surface 371 and the bottom surface 372, such as a side surface. In the present embodiment, the holding unit 33 is constituted by general opto-mechanical components, and in order to avoid influencing thermal related behaviors of the device under test 37, such as cooling behavior, the contacting portion that the holding unit 33 contacts the device under test 37 is made of materials of "heat-insulation function," such as insulation foam, so as to prevent thermal energy of the device under test 37 dispersing from the holding unit 33 to the surrounding. On the other hand, the thermal signal capture unit 35 is provided for capturing a thermal signal of the top surface 371 and a thermal signal of the bottom surface 372.

Further, the thermal reflection unit 34 is arranged toward the device under test 37 so as to image a thermal signal of the top surface 371 of the device under test 37 on an imaging position 341. In the present embodiment, the thermal reflection unit 34 relates to a concave mirror, and that the concave mirror is coated, on its reflective surface, with a heat reflective film 342. Preferably, in the present embodiment, the heat reflective film 342 is of a material of gold or silver so as to effectively image the thermal signal of the top surface 371 of the device under test 37 on the imaging position 341.

As shown in FIG. 3, the thermal signal capture unit 35 can capture the thermal signal of the top surface 371 of the device under test 37, and the thermal signal of the bottom surface 372 of the device under test 37, from the imaging position 341. In the present embodiment, the thermal signal capture unit 35 relates to a thermal camera, a mid-wavelength infrared detector, or a long-wavelength infrared detector. Eventually, the control and computation unit 36, based on the top-surface thermal signal and the bottom-surface thermal signal of the device under test 37 captured by the thermal signal capture unit 35, computes multiple thermal property values of the device under test 37, such as but not limit to, thermal resistance, heat capacity, and thermal diffusion parameters.

A comparison between the thermal properties measurement system of the first embodiment and the thermal properties measurement system of the second embodiment shows that the latter has the following differences:

(a) The second light modulation unit 322 relates to an imaging lens set, such as but not limit to, a convex lens set, rather than a galvo scanner; and (b) The top surface 371 and the bottom surface 372 of the device under test 37 are coated with a top graphite layer 373 and a bottom graphite layer 374, respectively, so that the top-surface thermal signal and the bottom-surface thermal signal of the device under test 37 can be more clear.

Therefore, it is understood that the operational manner of the second embodiment of the thermal properties measurement system is similar to that of the first embodiment of the thermal properties measurement system. As such, detailed description on operation of the second embodiment of the thermal properties measurement system seems redundant.

The thermal properties measurement system, according to the second embodiment, uses a light field, which has a specific distribution of intensity after modulation, to illuminate on the device under test 37 so as to heat the device under test 37 by the illumination pattern, and to simulate a temperature distribution of the device under test 37 in a state of continuous operation. Besides, through the thermal signal capture unit 35, the thermal signal of the top surface 371 and the thermal signal of the bottom surface 372 of the device under test 37 can be captured. As such, the thermal properties measurement system, according to the second embodiment, does not need to actually light up the device under test 37 nor to apply any electric power to the device under test 37 (as the measurement manner adopted in the conventional thermal properties measurement system), the device under test 37 can be promptly measured for its various thermal property values, such as thermal resistance, heat capacity, thermal diffusion parameters, and so forth.

Figure 4:
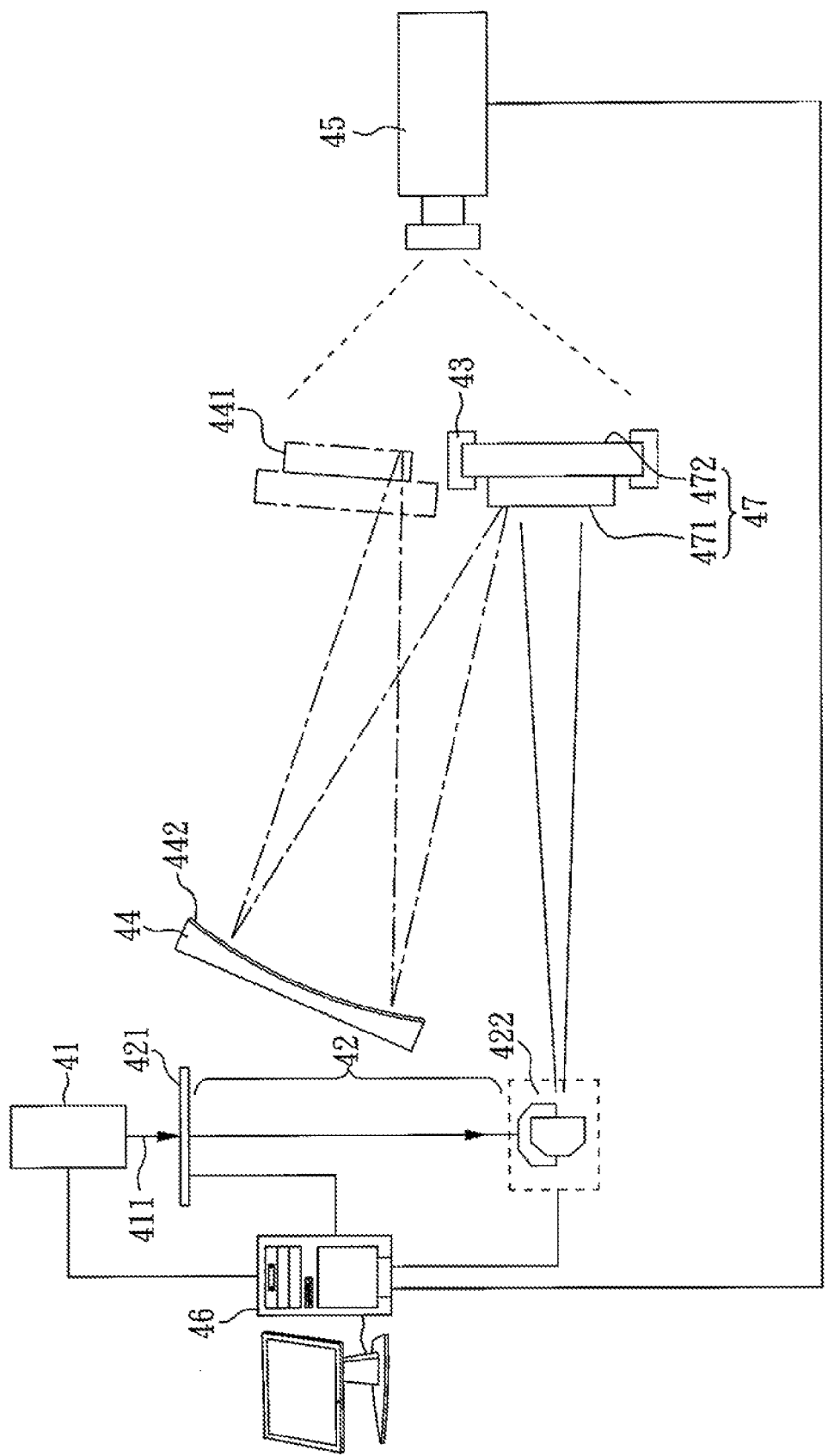
FIG. 4 is a schematic view illustrating a highly adaptive thermal properties measurement system according to a third embodiment of the present invention.

Referring to FIG. 4, a schematic view illustrating a highly adaptive thermal properties measurement system according to a third embodiment of the present invention, the measurement system comprises a light source unit 41, a light modulation module 42, a holding unit 43, a thermal reflection unit 44, a thermal signal capture unit 45, and a control and computation unit 46. Further, the highly adaptive thermal properties measurement system, according to the third embodiment of the present invention, is provided for measuring plural thermal property values of a device under test 47 having a top surface 471 and a bottom surface 472. Still further, the control and computation unit 46 is coupled with the light source unit 41 and the thermal signal capture unit 45, respectively, so as to control operation of the light source unit 41 and the thermal signal capture unit 45 during a measurement process.

According to the present embodiment, the device under test 47 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 41 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave or pulse so long as making the device under test 47 produce a measurable temperature variation.

In the present embodiment, the light source unit 41 is used to provide a light field 411. Besides, the light modulation module 42 is used to modulate a distribution of intensity of the light field 411. The light modulation module 42 includes a first light modulation unit 421 and a second light modulation unit 422 such that light passes first through the first light modulation unit 421 and then through the second light modulation unit 422. The first light modulation unit 421 relates to a spatial light modulator (SLM) and the second light modulation unit 422 to a galvo scanner. The first light modulation unit 421 and the second light modulation unit 422 are coupled with the control and computation unit 46, respectively. Further, the holding unit 43 is provided for holding the device under test 47, and that the holding unit 43 holds a surface other than the top surface 471 and the bottom surface 472, such as a side surface. In the present embodiment, the holding unit 43 is constituted by general opto-mechanical components, and in order to avoid influencing thermal related behaviors of the device under test 47, such as cooling behavior, the contacting portion that the holding unit 43 contacts the device under test 47 is made of materials of "heat-insulation function," such as insulation foam, so as to prevent thermal energy of the device under test 47 dispersing from the holding unit 43 to the surrounding. On the other hand, the thermal signal capture unit 45 is provided for capturing a thermal signal of the top surface 471 and a thermal signal of the bottom surface 472.

Further, the thermal reflection unit 44 is arranged toward the device under test 47 so as to image a thermal signal of the top surface 471 of the device under test 47 on an imaging position 441. In the present embodiment, the thermal reflection unit 44 relates to a concave mirror, and that the concave mirror is coated, on its reflective surface, with a heat reflective film 442. Preferably, in the present embodiment, the heat reflective film 442 is of a material of gold or silver so as to effectively image the thermal signal of the top surface 471 of the device under test 47 on the imaging position 441.

As shown in FIG. 4, the thermal signal capture unit 45 can capture the thermal signal of the top surface 471 of the device under test 47, and the thermal signal of the bottom surface 472 of the device under test 47, from the imaging position 441. Eventually, the control and computation unit 46, based on the top-surface thermal signal and the bottom-surface thermal signal of the device under test 47 captured by the thermal signal capture unit 45, computes multiple thermal property values of the device under test 47, such as but not limit to, thermal resistance, heat capacity, and thermal diffusion parameters.

A comparison between the thermal properties measurement system of the first embodiment and the thermal properties measurement system of the third embodiment shows that the latter has the following differences: The first light modulation unit 421 relates to a spatial light modulator, whereas the spatial light modulator relates to a penetrative spatial light modulator, such as but not limit to, a TN-type liquid crystal sheet. This spatial light modulator receives control from the control and computation unit 46 such that the light field 411 can only reach to the second light modulation unit 422 by passing through some pre-determined pixel positions.

Therefore, it is understood that the operational manner of the third embodiment of the thermal properties measurement system is similar to that of the first embodiment of the thermal properties measurement system. As such, detailed description on operation of the third embodiment of the thermal properties measurement system seems redundant.

The thermal properties measurement system, according to the third embodiment, uses a light field, which has a specific distribution of intensity after modulation, to illuminate on the device under test 47 so as to heat the device under test 47 by the illumination pattern, and to simulate a temperature distribution of the device under test 47 in a state of continuous operation. Besides, through the thermal signal capture unit 45, the thermal signal of the top surface 471 and the thermal signal of the bottom surface 472 of the device under test 47 can be captured. As such, the thermal properties measurement system, according to the third embodiment, does not need to actually light up the device under test 47 nor to apply any electric power to the device under test 47 (as the measurement manner adopted in the conventional thermal properties measurement system), the device under test 47 can be promptly measured for its various thermal property values, such as thermal resistance, heat capacity, thermal diffusion parameters, and so forth.

Figure 5:
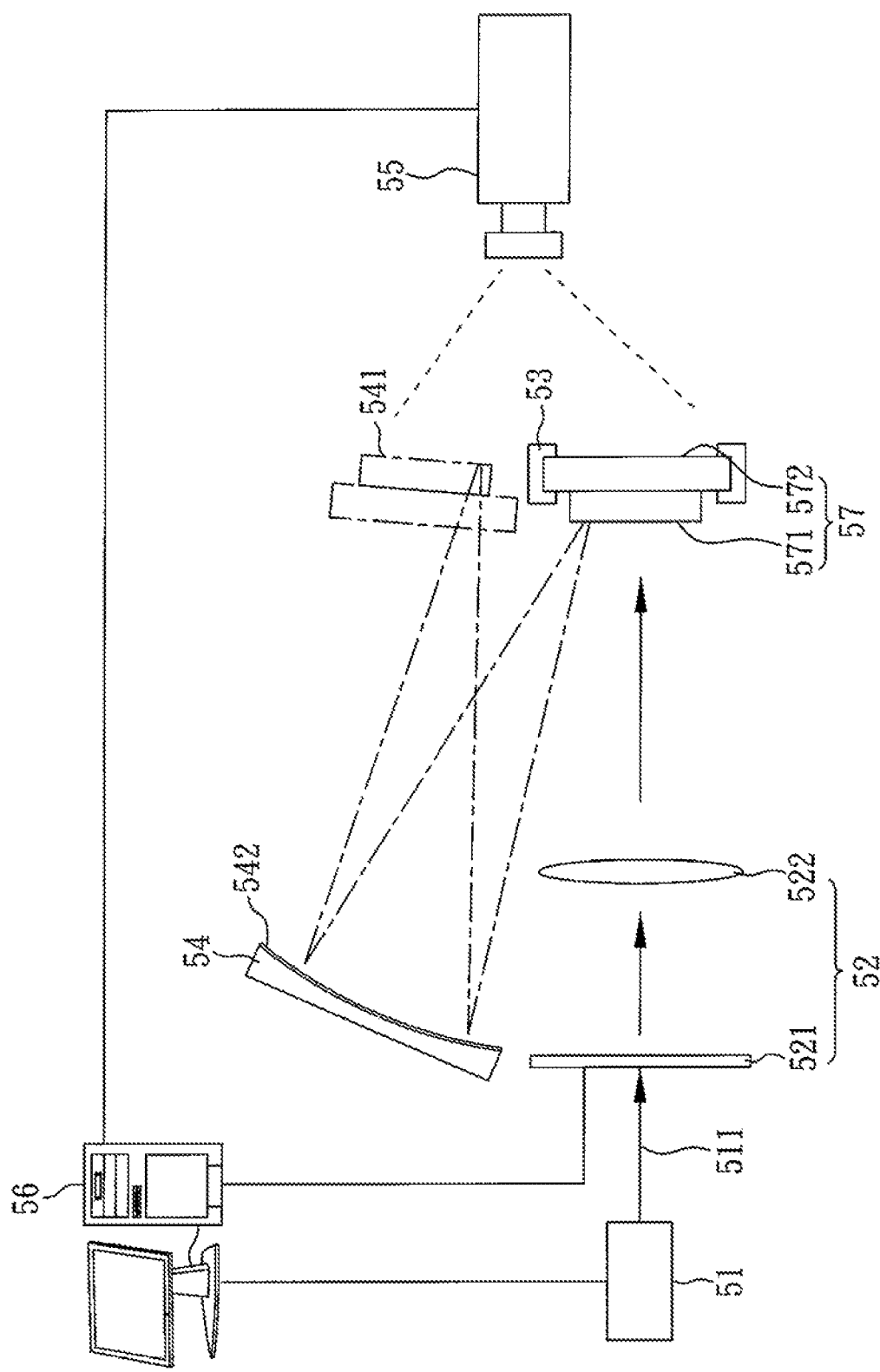
FIG. 5 is a schematic view illustrating a highly adaptive thermal properties measurement system according to a fourth embodiment of the present invention.

Referring to FIG. 5, a schematic view illustrating a highly adaptive thermal properties measurement system according to a fourth embodiment of the present invention, the measurement system comprises a light source unit 51, a light modulation module 52, a holding unit 53, a thermal reflection unit 54, a thermal signal capture unit 55, and a control and computation unit 56. Further, the highly adaptive thermal properties measurement system, according to the fourth embodiment of the present invention, is provided for measuring plural thermal property values of a device under test 57 having a top surface 571 and a bottom surface 572. Still further, the control and computation unit 56 is coupled with the light source unit 51 and the thermal signal capture unit 55, respectively, so as to control operation of the light source unit 51 and the thermal signal capture unit 55 during a measurement process.

According to the present embodiment, the device under test 57 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 51 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave or pulse so long as making the device under test 57 produce a measurable temperature variation.

In the present embodiment, the light source unit 51 is used to provide a light field 511. Besides, the light modulation module 52 is used to modulate a distribution of intensity of the light field 511. The light modulation module 52 includes a first light modulation unit 521 and a second light modulation unit 522 such that light passes first through the first light modulation unit 521 and then through the second light modulation unit 522. The first light modulation unit 521 relates to a spatial light modulator and the second light modulation unit 522 to an imaging lens set. The first light modulation unit 521 and the second light modulation unit 522 are coupled with the control and computation unit 56, respectively. Further, the holding unit 53 is provided for holding the device under test 57, and that the holding unit 53 holds a surface other than the top surface 571 and the bottom surface 572, such as a side surface. In the present embodiment, the holding unit 53 is constituted by general opto-mechanical components, and in order to avoid influencing thermal related behaviors of the device under test 57, such as cooling behavior, the contacting portion that the holding unit 53 contacts the device under test 57 is made of materials of "heat-insulation function," such as insulation foam, so as to prevent thermal energy of the device under test 57 dispersing from the holding unit 53 to the surrounding. On the other hand, the thermal signal capture unit 55 is provided for capturing a thermal signal of the top surface 571 and a thermal signal of the bottom surface 572.

Further, the thermal reflection unit 54 is arranged toward the device under test 57 so as to image a thermal signal of the top surface 571 of the device under test 57 on an imaging position 541. In the present embodiment, the thermal reflection unit 54 relates to a concave mirror, and that the concave mirror is coated, on its reflective surface, with a heat reflective film 542. Preferably, in the present embodiment, the heat reflective film 542 is of a material of gold or silver so as to effectively image the thermal signal of the top surface 571 of the device under test 57 on the imaging position 541.

As shown in FIG. 5, the thermal signal capture unit 55 can capture the thermal signal of the top surface 571 of the device under test 57, and the thermal signal of the bottom surface 572 of the device under test 57, from the imaging position 541. Eventually, the control and computation unit 56, based on the top-surface thermal signal and the bottom-surface thermal signal of the device under test 57 captured by the thermal signal capture unit 55, computes multiple thermal property values of the device under test 57, such as but not limit to, thermal resistance, heat capacity, and thermal diffusion parameters.

A comparison between the thermal properties measurement system of the third embodiment and the thermal properties measurement system of the fourth embodiment shows that the latter has the following differences: The second light modulation unit 522 relates to an imaging lens set, such as but not limited to, a convex lens.

Therefore, it is understood that the operational manner of the fourth embodiment of the thermal properties measurement system is actually similar to that of the third embodiment of the thermal properties measurement system, and also similar to that of the first embodiment of the thermal properties measurement system. As such, detailed description on operation of the fourth embodiment of the thermal properties measurement system seems redundant.

The thermal properties measurement system, according to the fourth embodiment, uses a light field, which has a specific distribution of intensity after modulation, to illuminate on the device under test 57 so as to heat the device under test 57 by the illumination pattern, and to simulate a temperature distribution of the device under test 57 in a state of continuous operation. Besides, through the thermal signal capture unit 55, the thermal signal of the top surface 571 and the thermal signal of the bottom surface 572 of the device under test 57 can be captured. As such, the thermal properties measurement system, according to the fourth embodiment, does not need to actually light up the device under test 57 nor to apply any electric power to the device under test 57 (as the measurement manner adopted in the conventional thermal properties measurement system), the device under test 57 can be promptly measured for its various thermal property values, such as thermal resistance, heat capacity, thermal diffusion parameters, and so forth.

Figure 6:
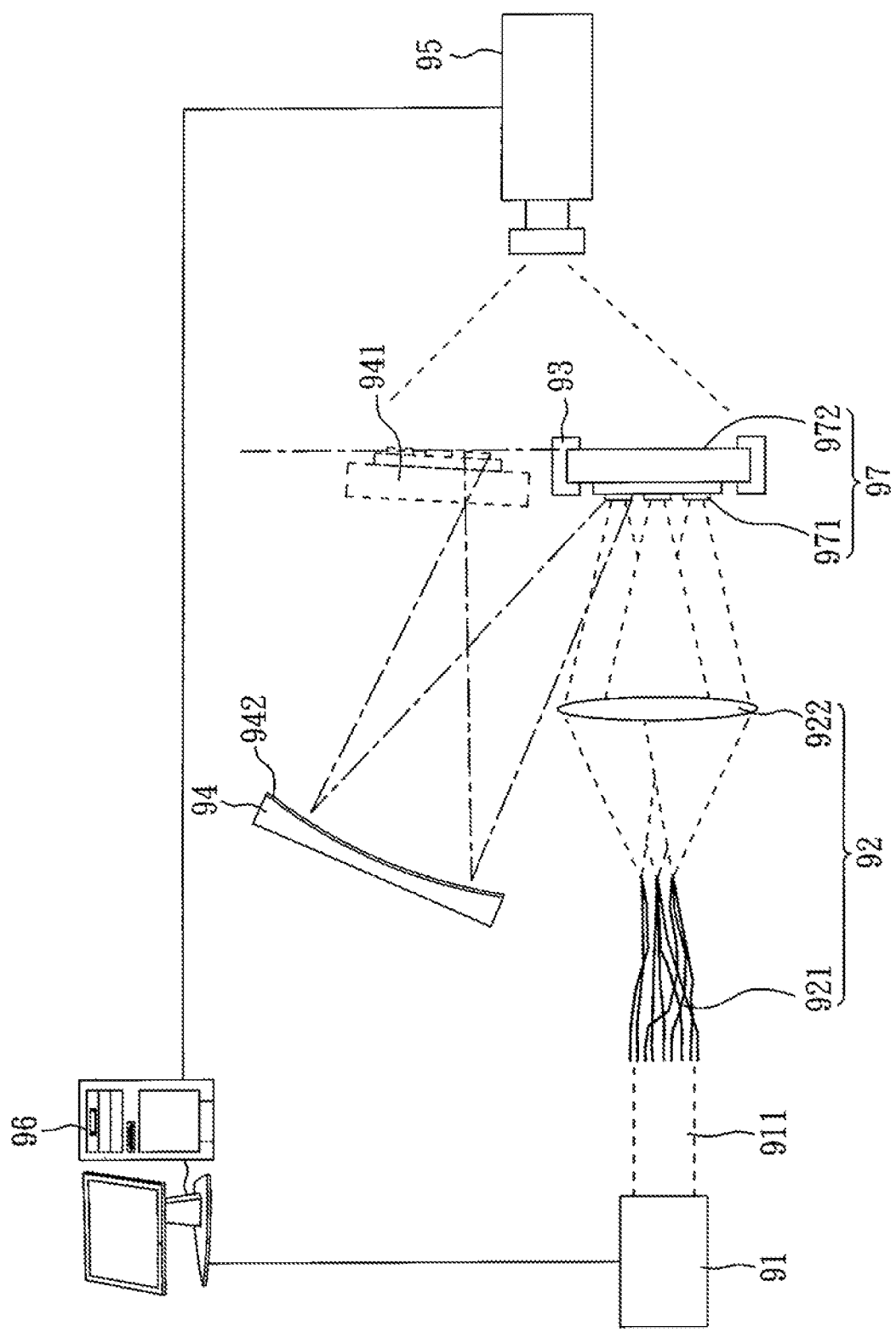
FIG. 6 is a schematic view illustrating a highly adaptive thermal properties measurement system according to a fifth embodiment of the present invention.

Referring to FIG. 6, a schematic view illustrating a highly adaptive thermal properties measurement system according to a fifth embodiment of the present invention, the measurement system comprises a light source unit 91, a light modulation module 92, a holding unit 93, a thermal reflection unit 94, a thermal signal capture unit 95, and a control and computation unit 96. Further, the thermal properties measurement system, according to the fifth embodiment of the present invention, is provided for measuring plural thermal property values of a device under test 97 having a top surface 971 and a bottom surface 972. Still further, the control and computation unit 96 is coupled with the light source unit 91 and the thermal signal capture unit 95, respectively, so as to control operation of the light source unit 91 and the thermal signal capture unit 95 during a measurement process.

According to the present embodiment, the device under test 97 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 91 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave or pulse so long as making the device under test 97 produce a measurable temperature variation.

In the present embodiment, the light source unit 91 is used to provide a light field 911. Besides, the light modulation module 92 is used to modulate a distribution of intensity of the light field 911. The light modulation module 92 includes a first light modulation unit 921 and a second light modulation unit 922 such that light passes first through the first light modulation unit 921 and then through the second light modulation unit 922. The first light modulation unit 921 relates to a fiber bundle and the second light modulation unit 922 to an imaging lens set. Further, the holding unit 93 is provided for holding the device under test 97, and that the holding unit 93 holds a surface other than the top surface 971 and the bottom surface 972, such as a side surface. In the present embodiment, the holding unit 93 is constituted by general opto-mechanical components, and in order to avoid influencing thermal related behaviors of the device under test 97, such as cooling behavior, the contacting portion that the holding unit 93 contacts the device under test 97 is made of materials of "heat-insulation function," such as insulation foam, so as to prevent thermal energy of the device under test 97 dispersing from the holding unit 93 to the surrounding. On the other hand, the thermal signal capture unit 95 is provided for capturing a thermal signal of the top surface 971 and a thermal signal of the bottom surface 972.

Further, the thermal reflection unit 94 is arranged toward the device under test 97 so as to image a thermal signal of the top surface 971 of the device under test 97 on an imaging position 941. In the present embodiment, the thermal reflection unit 94 relates to a concave mirror, and that the concave mirror is coated, on its reflective surface, with a heat reflective film 942. Preferably, in the present embodiment, the heat reflective film 942 is of a material of gold or silver so as to effectively image the thermal signal of the top surface 971 of the device under test 97 on the imaging position 941.

As shown in FIG. 6, the thermal signal capture unit 95 can capture the thermal signal of the top surface 971 of the device under test 97, and the thermal signal of the bottom surface 972 of the device under test 97, from the imaging position 941. Eventually, the control and computation unit 96, based on the top-surface thermal signal and the bottom-surface thermal signal of the device under test 97 captured by the thermal signal capture unit 95, computes multiple thermal property values of the device under test 97, such as but not limit to, thermal resistance, heat capacity, and thermal diffusion parameters.

A comparison between the thermal properties measurement system of the fourth embodiment and the thermal properties measurement system of the fifth embodiment shows that the latter has the following differences: The first light modulation unit 921 relates to a fiber bundle for reducing waste of the energy of the high power laser. In addition, it is possible to array the fiber bundle in advance according to a specific position (such as where a chip is arranged) that the top surface 971 of the device under test 97 is irradiated such that through the imaging lens set of the second light modulation unit 922, each specific position on the top surface 971 of the device under test 97 can be precisely and collectively irradiated. As such, advantages of flexibly adjusting the position of light collection and flexibly adjusting the specific distribution of intensity can be obtained.

Therefore, it is understood that the operational manner of the fifth embodiment of the thermal properties measurement system is similar to that of the fourth embodiment of the thermal properties measurement system, and also similar to that of the first embodiment of the thermal properties measurement system. As such, detailed description on operation of the fifth embodiment of the thermal properties measurement system seems redundant.

The thermal properties measurement system, according to the fifth embodiment, uses a light field, which has a specific distribution of intensity after a flexible modulation, to illuminate on the device under test 97 so as to heat the device under test 97 by the illumination pattern, and to simulate a temperature distribution of the device under test 97 in a state of continuous operation. Besides, through the thermal signal capture unit 95, the thermal signal of the top surface 971 and the thermal signal of the bottom surface 972 of the device under test 97 can be captured. As such, the thermal properties measurement system, according to the fifth embodiment, does not need to actually light up the device under test 97 nor to apply any electric power to the device under test 97 (as the measurement manner adopted in the conventional thermal properties measurement system), the device under test 97 can be promptly measured for its various thermal property values, such as thermal resistance, heat capacity, thermal diffusion parameters, and so forth.

Figure 7:
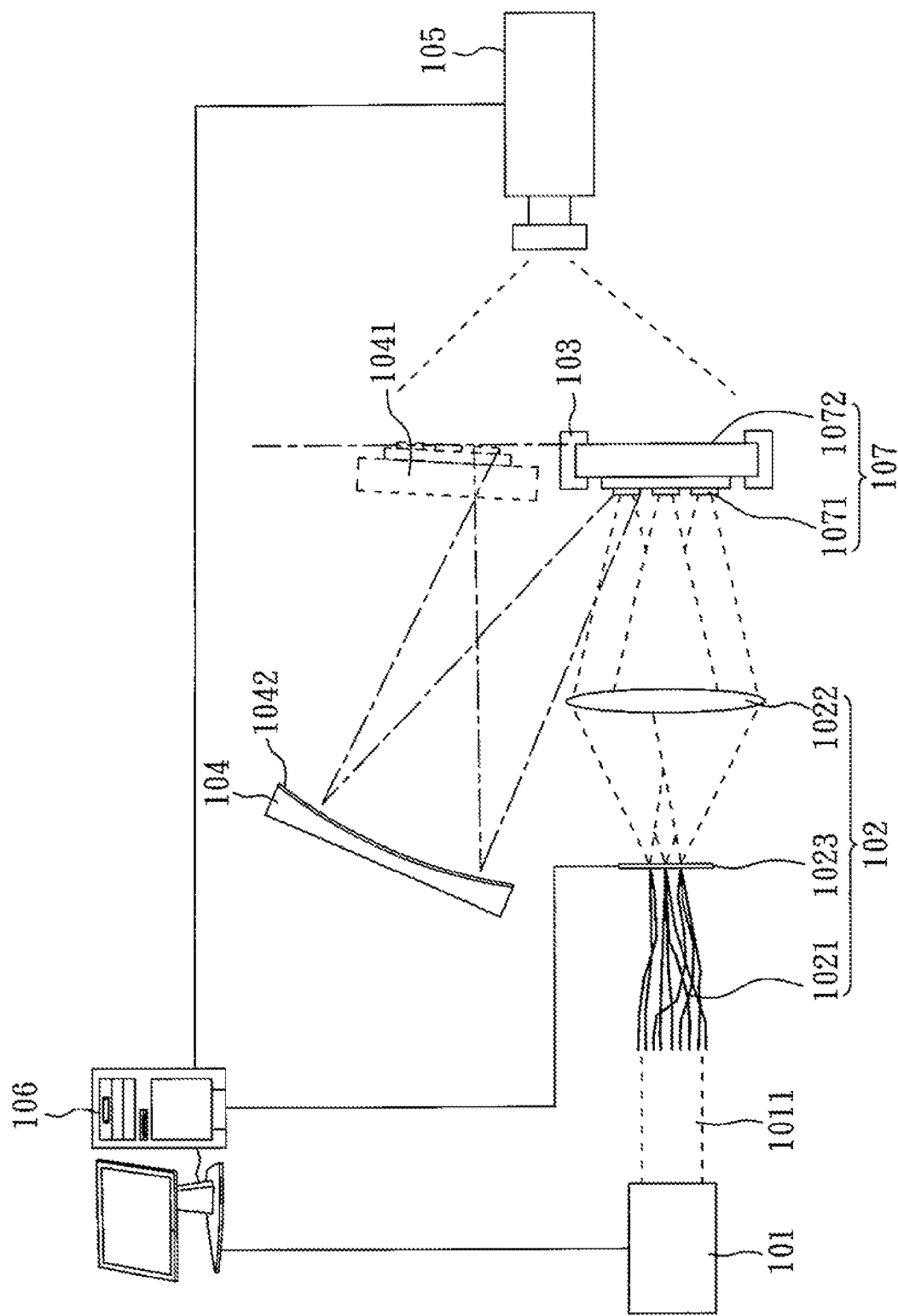
FIG. 7 is a schematic view illustrating a highly adaptive thermal properties measurement system according to a sixth embodiment of the present invention.

Referring to FIG. 7, a schematic view illustrating a thermal properties measurement system according to a sixth embodiment of the present invention, the measurement system comprises a light source unit 101, a light modulation module 102, a holding unit 103, a thermal reflection unit 104, a thermal signal capture unit 105, and a control and computation unit 106. Further, the thermal properties measurement system, according to the sixth embodiment of the present invention, is provided for measuring plural thermal property values of a device under test 107 having a top surface 1071 and a bottom surface 1072. Still further, the control and computation unit 106 is coupled with the light source unit 101 and the thermal signal capture unit 105, respectively, so as to control operation of the light source unit 101 and the thermal signal capture unit 105 during a measurement process.

According to the present embodiment, the device under test 107 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 101 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave or pulse so long as making the device under test 107 produce a measurable temperature variation.

In the present embodiment, the light source unit 101 is used to provide a light field 1011. Besides, the light modulation module 102 is used to modulate a distribution of intensity of the light field 1011. The light modulation module 102 includes a first light modulation unit 1021, a second light modulation unit 1022, and a third light modulation unit 1023 such that light passes first through the first light modulation unit 1021 and then, in sequence, through the third light modulation unit 1023 and the second light modulation unit 1022. The first light modulation unit 1021 relates to a fiber bundle, the second light modulation unit 1022 to an imaging lens set, and the third light modulation unit 1023 to a spatial light modulator. In addition, the third light modulation unit 1023 is coupled with the control and computation unit 106. Further, the holding unit 103 is provided for holding the device under test 107, and that the holding unit 103 holds a surface other than the top surface 1071 and the bottom surface 1072, such as a side surface. In the present embodiment, the holding unit 103 is constituted by general opto-mechanical components, and in order to avoid influencing thermal related behaviors of the device under test 107, such as cooling behavior, the contacting portion that the holding unit 103 contacts the device under test 107 is made of materials of "heat-insulation function," such as insulation foam, so as to prevent thermal energy of the device under test 107 dispersing from the holding unit 103 to the surrounding. On the other hand, the thermal signal capture unit 105 is provided for capturing a thermal signal of the top surface 1071 and a thermal signal of the bottom surface 1072.

Further, the thermal reflection unit 104 is arranged toward the device under test 107 so as to image a thermal signal of the top surface 1071 of the device under test 107 on an imaging position 1041. In the present embodiment, the thermal reflection unit 104 relates to a concave mirror, and that the concave mirror is coated, on its reflective surface, with a heat reflective film 1042. Preferably, in the present embodiment, the heat reflective film 1042 is of a material of gold or silver so as to effectively image the thermal signal of the top surface 1071 of the device under test 107 on the imaging position 1041.

As shown in FIG. 7, the thermal signal capture unit 105 can capture the thermal signal of the top surface 1071 of the device under test 107 from the imaging position 1041, and the thermal signal of the bottom surface 1072 of the device under test 107 from the holding unit 103. Eventually, the control and computation unit 106, based on the top-surface thermal signal and the bottom-surface thermal signal of the device under test 107 captured by the thermal signal capture unit 105, computes multiple thermal property values of the device under test 107, such as but not limit to, thermal resistance, heat capacity, and thermal diffusion parameters.

A comparison between the thermal properties measurement system of the fifth embodiment and the thermal properties measurement system of the sixth embodiment shows that the latter has the following differences: The light modulation module 102 further includes the third light modulation unit 1023, where the third light modulation unit 1023 relates to a spatial light modulator, namely a penetrative spatial light modulator, such as but not limited to, a TN-type liquid crystal sheet. This spatial light modulator, according to the six embodiment of the present invention, receives control from the control and computation unit 106 such that the light field 1011, after passing through the fiber bundle of the first light modulation unit 1021, or other light fields passing through the fiber bundle, can be flexibly controlled by the spatial light modulator so as to pass therethrough according to pre-determined pixel positions, or according to pre-determined frequencies or time. As such, advantages of more flexibly adjusting specific distribution of intensity, position, and frequency can be obtained.

Therefore, it is understood that the operational manner of the sixth embodiment of the thermal properties measurement system is actually similar to that of the fifth embodiment of the thermal properties measurement system, and also to that of the first embodiment of the thermal properties measurement system. As such, detailed description on operation of the sixth embodiment of the thermal properties measurement system seems redundant.

The thermal properties measurement system, according to the sixth embodiment, uses a light field, which has a specific distribution of intensity, position, and frequency after flexible modulation, to illuminate on the device under test 107 so as to heat the device under test 107 by the illumination pattern, and to simulate a temperature distribution of the device under test 107 in a state of continuous operation. Besides, through the thermal signal capture unit 105, the thermal signal of the top surface 1071 and the thermal signal of the bottom surface 1072 of the device under test 107 can be captured. As such, the thermal properties measurement system, according to the sixth embodiment, does not need to actually light up the device under test 107 nor to apply any electric power to the device under test 107 (as the measurement manner adopted in the conventional thermal properties measurement system), the device under test 107 can be promptly measured for its various thermal property values, such as thermal resistance, heat capacity, thermal diffusion parameters, and so forth.

Figure 8:
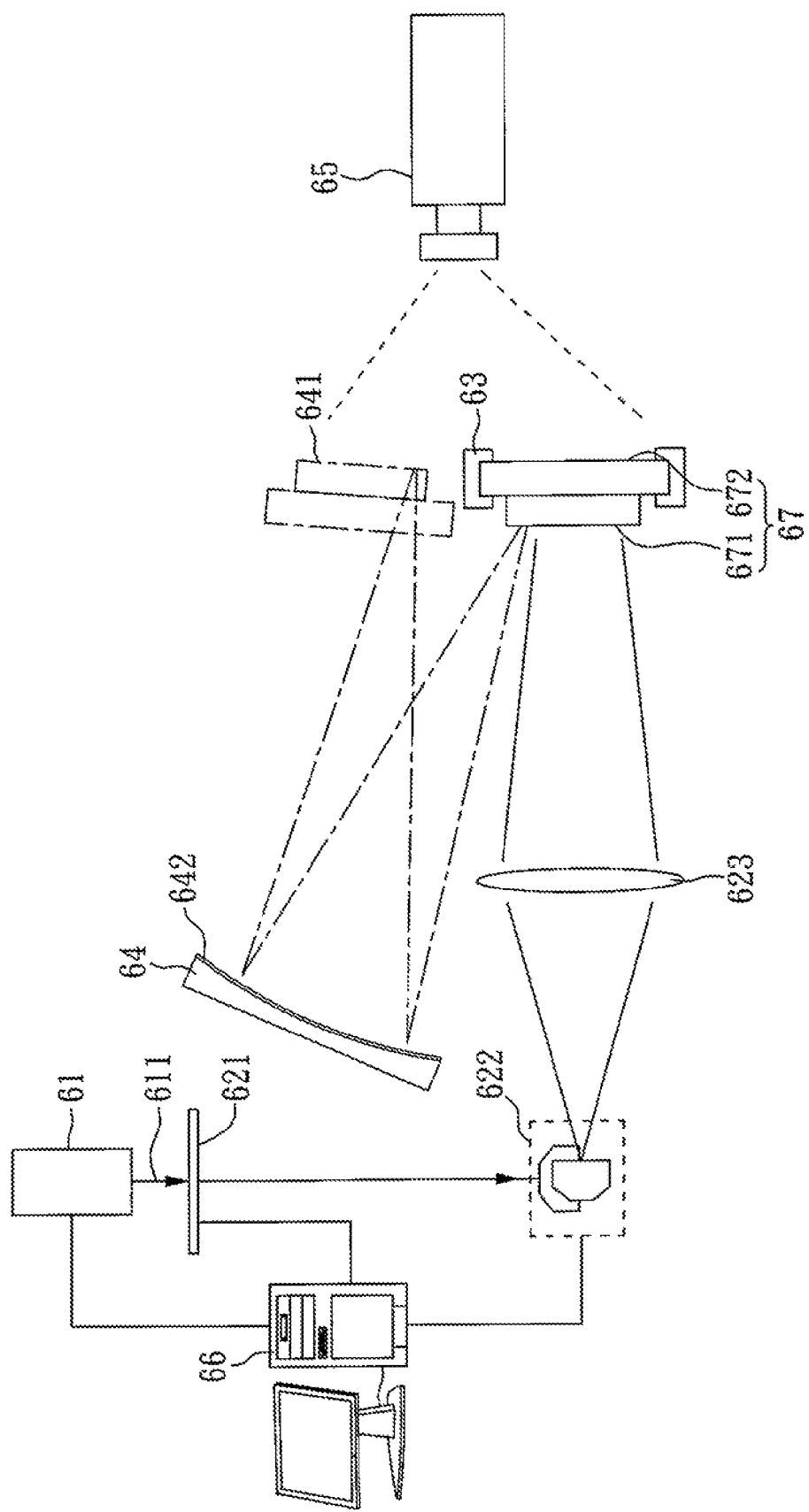
FIG. 8 is a schematic view illustrating a highly adaptive thermal properties measurement system according to a seventh embodiment of the present invention.

Referring to FIG. 8, a schematic view illustrating a thermal properties measurement system according to a seventh embodiment of the present invention, the measurement system comprises a light source unit 61, a light modulation module 62, a holding unit 63, a thermal reflection unit 64, a thermal signal capture unit 65, and a control and computation unit 66. Further, the thermal properties measurement system, according to the seventh embodiment of the present invention, is provided for measuring plural thermal property values of a device under test 67 having a top surface 671 and a bottom surface 672. Still further, the control and computation unit 66 is coupled with the light source unit 61 and the thermal signal capture unit 65, respectively, so as to control operation of the light source unit 61 and the thermal signal capture unit 65 during a measurement process.

According to the present embodiment, the device under test 67 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 61 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave or pulse so long as making the device under test 67 produce a measurable temperature variation.

In the present embodiment, the light source unit 61 is used to provide a light field 611. Besides, the light modulation module 62 is used to modulate a distribution of intensity of the light field 611. The light modulation module 62 includes a first light modulation unit 621, a second light modulation unit 622, and a third light modulation unit 623 such that light passes first through the first light modulation unit 621 and then, in sequence, through the second light modulation unit 622 and the third light modulation unit 623. The first light modulation unit 621 relates to a spatial light modulator, the second light modulation unit 622 to a galvo scanner, and the third light modulation unit 623 to an imaging lens set. In addition, the first light modulation unit 621 and the second light modulation unit 622 are coupled with the control and computation unit 66, respectively. Further, the holding unit 63 is provided for holding the device under test 67, and that the holding unit 63 holds a surface other than the top surface 671 and the bottom surface 672, such as a side surface. In the present embodiment, the holding unit 63 is constituted by general opto-mechanical components, and in order to avoid influencing thermal related behaviors of the device under test 67, such as cooling behavior, the contacting portion that the holding unit 63 contacts the device under test 67 is made of materials of "heat-insulation function," such as insulation foam, so as to prevent thermal energy of the device under test 67 dispersing from the holding unit 63 to the surrounding. On the other hand, the thermal signal capture unit 65 is provided for capturing a thermal signal of the top surface 671 and a thermal signal of the bottom surface 672.

Further, the thermal reflection unit 64 is arranged toward the device under test 67 so as to image a thermal signal of the top surface 671 of the device under test 67 on an imaging position 641. In the present embodiment, the thermal reflection unit 64 relates to a concave mirror, and that the concave mirror is coated, on its reflective surface, with a heat reflective film 642. Preferably, in the present embodiment, the heat reflective film 642 is of a material of gold or silver so as to effectively image the thermal signal of the top surface 671 of the device under test 67 on the imaging position 641.

As shown in FIG. 7, the thermal signal capture unit 65 can capture the thermal signal of the top surface 671 of the device under test 67 from the imaging position 641, and the thermal signal of the bottom surface 672 of the device under test 67 from the holding unit 63. Eventually, the control and computation unit 66, based on the top-surface thermal signal and the bottom-surface thermal signal of the device under test 67 captured by the thermal signal capture unit 65, computes multiple thermal property values of the device under test 67, such as but not limit to, thermal resistance, heat capacity, and thermal diffusion parameters.

A comparison between the thermal properties measurement system of the third embodiment and the thermal properties measurement system of the seventh embodiment shows that the latter has the following differences: The light modulation module 62 further includes the third light modulation unit 623, where the third light modulation unit 623 relates to an imaging lens set, such as but not limited to a convex lens.

Therefore, it is understood that the operational manner of the seventh embodiment of the thermal properties measurement system is actually similar to that of the third embodiment of the thermal properties measurement system, and also to that of the first embodiment of the thermal properties measurement system. As such, detailed description on operation of the seventh embodiment of the thermal properties measurement system seems redundant.

The thermal properties measurement system, according to the seventh embodiment, uses a light field, which has a specific distribution of intensity after modulation, to illuminate on the device under test 67 so as to heat the device under test 67 by the illumination pattern, and to simulate a temperature distribution of the device under test 67 in a state of continuous operation. Besides, through the thermal signal capture unit 65, the thermal signal of the top surface 671 and the thermal signal of the bottom surface 672 of the device under test 67 can be captured. As such, the thermal properties measurement system, according to the seventh embodiment, does not need to actually light up the device under test 67 nor to apply any electric power to the device under test 67 (as the measurement manner adopted in the conventional thermal properties measurement system), the device under test 67 can be promptly measured for its various thermal property values, such as thermal resistance, heat capacity, thermal diffusion parameters, and so forth.

Figure 9:
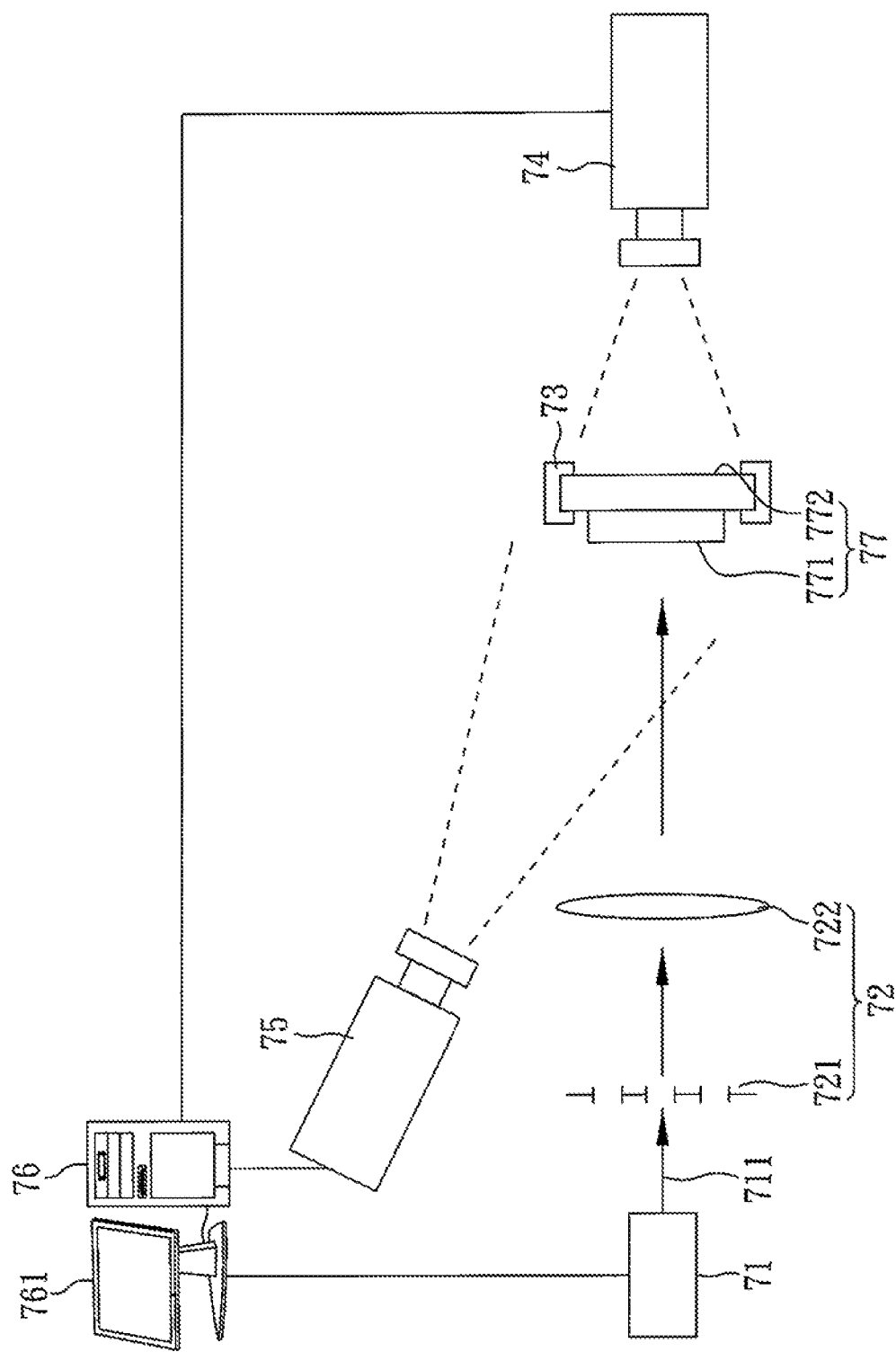
FIG. 9 is a schematic view illustrating a highly adaptive thermal properties measurement system according to an eighth embodiment of the present invention.

Referring to FIG. 9, a schematic view illustrating a thermal properties measurement system according to an eighth embodiment of the present invention, the measurement system comprises a light source unit 71, a light modulation module 72, a holding unit 73, a first thermal signal capture unit 74, a second thermal signal capture unit 75, and a control and computation unit 76. Further, the thermal properties measurement system, according to the eighth embodiment of the present invention, is provided for measuring plural thermal property values of a device under test 77 having a top surface 771 and a bottom surface 772. Still further, the control and computation unit 76 is coupled with the light source unit 71, the first thermal signal capture unit 74, and the second thermal signal capture unit 75, respectively, so as to control operation of the light source unit 71, the first thermal signal capture unit 74, and the second thermal signal capture unit 75 during a measurement process.

According to the present embodiment, the device under test 77 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 71 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave or pulse so long as making the device under test 77 produce a measurable temperature variation.

In the present embodiment, the light source unit 71 is used to provide a light field 711. Besides, the light modulation module 72 is used to modulate a distribution of intensity of the light field 711, such as spatial modulation or temporal modulation. As shown in FIG. 9, the light modulation module 72 includes a first light modulation unit 721 and a second light modulation unit 722 such that light passes first through the first light modulation unit 721 and then through the second light modulation unit 722.

Further, the first light modulation unit 721 relates to an aperture, such as a rectangular aperture; and the second light modulation unit 722 to an imaging lens set, such as but not limited to a convex lens. As such, in the thermal properties measurement system, according to the present embodiment, the light modulation module 72 proceeds with a modulation on the "spatial distribution" of intensity of the light field 711.

Further, in the thermal properties measurement system, according to the present embodiment of the present invention, the holding unit 73 is provided for holding the device under test 77, and that the holding unit 73 holds a surface other than the top surface 771 and the bottom surface 772, such as a side surface. In the present embodiment, the holding unit 73 is constituted by general opto-mechanical components, and in order to avoid influencing thermal related behaviors of the device under test 77, such as cooling behavior, the contacting portion that the holding unit 73 contacts the device under test 77 is made of materials of "heat-insulation function," such as insulation foam, so as to prevent thermal energy of the device under test 77 dispersing from the holding unit 73 to the surrounding. On the other hand, the first thermal signal capture unit 74 is provided for capturing the thermal signal of a bottom surface of the device under test 77, and the second thermal signal capture unit 75 for capturing the thermal signal of a top surface of the device under test 77.

As shown in FIG. 9, the first thermal signal capture unit 74 is arranged toward the device under test 77, and that the second thermal signal capture unit 75 is arranged on the holding device 73 at one side opposite to that of the first thermal signal capture unit 74. In the present embodiment, the first thermal signal capture unit 74 and the second thermal signal capture unit 75 relate, respectively, to a thermal camera, a mid-wavelength infrared detector, or a long-wavelength infrared detector.

When the thermal properties measurement system, according to the eighth embodiment, operates, the device under test 77 is held by the holding unit 73. Thereafter, the control and computation unit 76 will govern the light source unit 71 to irradiate a light field 711 (like the aforementioned high power laser) such that light passes through an aperture acting as the first light modulation unit 721, and through an imaging lens set acting as the second light modulation unit 722, and then illuminates on the device under test 77. The light field 711 illuminates on the device under test 77 with a specific distribution of intensity so as to heat the device under test by the illumination pattern. As such, the device under test 77 is heated in accordance with a preset heating model such that the distribution of overall temperature of the device under test 77 can be consistent with a preset distribution pattern, so as to simulate a temperature distribution of the device under test 77 in a state of continuous operation, such as the state that a plurality of LED modules of an LED module sub-mount continues to operate for a certain period of time.

When the temperature distribution of the device under test 77 is consistent with a preset temperature distribution, such as the plural LED modules that reach to a specific temperature value, the control and computation unit 76 will, based on the bottom-surface thermal signal and top-surface thermal signal of the device under test 77 respectively captured by the first thermal signal capture unit 74 and the second thermal signal capture unit 75, compute multiple thermal property values of the device under test 77, such as but not limited to, thermal resistance, heat capacity, and thermal diffusion parameters. Since computation of these thermal property values have been well known to those skilled in the art, description thereto may be redundant.

Further, in the thermal properties measurement system, according to this embodiment, the control and computation unit 76 relates to a computer having a display unit 761. Still further, the control and computation unit 76, based on the temperature distribution of the top-surface of the device under test 77 corresponding to the top-surface thermal signal and the temperature distribution of the bottom-surface of the device under test 77 corresponding to the bottom-surface thermal signal, computes multiple thermal property values of the device under test 77, such as thermal resistance, heat capacity, and thermal diffusion parameters. In this respect, the display unit 761 is used for displaying the top-surface thermal signal, the bottom-surface thermal signal, and these thermal property values.

Therefore, the thermal properties measurement system, according to the eighth embodiment, uses a light field, which has a specific distribution of intensity after modulation, to illuminate on the device under test 77 so as to heat the device under test 77 by the illumination pattern, and to simulate a temperature distribution of the device under test 77 in a state of continuous operation. Besides, through the thermal signal capture units 74, 75, the thermal signal of the top surface 771 and the thermal signal of the bottom surface 772 of the device under test 77 can be captured. As such, the thermal properties measurement system, according to the eighth embodiment, does not need to actually light up the device under test 77, nor to apply any electric power to the device under test 77 (as the measurement manner adopted in the conventional thermal properties measurement system), the device under test 77 can be promptly measured for its various thermal property values, such as thermal resistance, heat capacity, and thermal diffusion parameters, and so forth.

Figure 10:
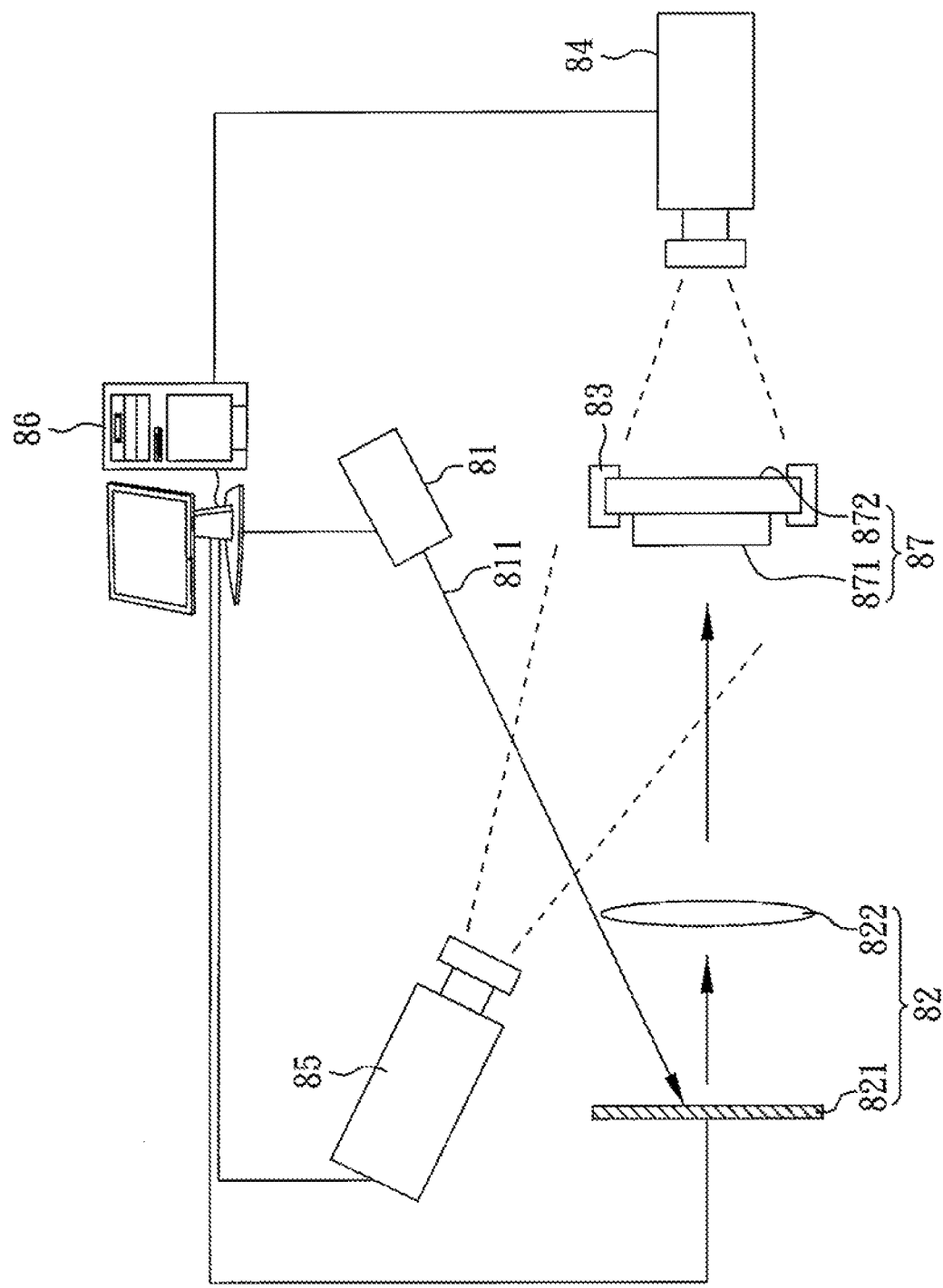
FIG. 10 is a schematic view illustrating a highly adaptive thermal properties measurement system according to a ninth embodiment of the present invention.

Referring to FIG. 10, a schematic view illustrating a thermal properties measurement system according to a ninth embodiment of the present invention, the measurement system comprises a light source unit 81, a light modulation module 82, a holding unit 83, a first thermal signal capture unit 84, a second thermal signal capture unit 85, and a control and computation unit 86. Further, the thermal properties measurement system, according to the ninth embodiment of the present invention, is provided for measuring plural thermal property values of a device under test 87 having a top surface 871 and a bottom surface 872. Still further, the control and computation unit 86 is coupled with the light source unit 81, the first thermal signal capture unit 84, and the second thermal signal capture unit 85, respectively, so as to control operation of the light source unit 81, the first thermal signal capture unit 84, and the second thermal signal capture unit 85 during a measurement process.

According to the present embodiment, the device under test 87 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 81 relates to a high power laser, such as one provides a wavelength of, but not limited to, 976 nm. Besides, the output power of the high power laser may only be necessary to make the device under test produce a measurable temperature variation, without any other limitation. Still further, the output of the high power laser may be of continuous wave or pulse so long as making the device under test 87 produce a measurable temperature variation.

In the present embodiment, the light source unit 81 is used to provide a light field 811. Besides, the light modulation module 82 is used to modulate a distribution of intensity of the light field 811. The light modulation module 82 includes a first light modulation unit 821 and a second light modulation unit 822 such that light passes first through the first light modulation unit 821 and then through the second light modulation unit 822. The first light modulation unit 821 relates to a spatial light modulator and the second light modulation unit 822 to an imaging lens set, where the first light modulation unit 821 is coupled with the control and computation unit 86. Further, the holding unit 83 is provided for holding the device under test 87, and that the holding unit 83 holds a surface other than the top surface 871 and the bottom surface 872, such as a side surface. In the present embodiment, the holding unit 83 is constituted by general opto-mechanical components, and in order to avoid influencing thermal related behaviors of the device under test 87, such as cooling behavior, the contacting portion that the holding unit 83 contacts the device under test 87 is made of materials of "heat-insulation function," such as insulation foam, so as to prevent thermal energy of the device under test 87 dispersing from the holding unit 83 to the surrounding. On the other hand, the first thermal signal capture unit 84 and the second thermal signal capture unit 85 are provided for capturing a thermal signal of the bottom surface 872 and a thermal signal of the top surface 871.

Further, the first thermal signal capture unit 84 is arranged toward the device under test 87, and that the second thermal signal capture unit 85 arranged at one side of the holding unit 83 opposite to the first thermal signal capture unit 84. In the present embodiment, the first thermal signal capture unit 84 and the second thermal signal capture unit 85 relate, respectively, to a thermal camera, a mid-wavelength infrared detector, or a long-wavelength infrared detector.

Eventually, the control and computation unit 86 will, based on a bottom-surface thermal signal and top-surface thermal signal of the device under test 87 respectively captured by the first thermal signal capture unit 84 and the second thermal signal capture unit 85, compute multiple thermal property values of the device under test 87, such as but not limited to, thermal resistance, heat capacity, and thermal diffusion parameters.

A comparison between the thermal properties measurement system of the eighth embodiment and the thermal properties measurement system of the ninth embodiment shows that the latter has the following differences: The first light modulation unit 821 relates to a spatial light modulator, whereas the spatial light modulator relates to a reflective spatial light modulator, such as but not limit to, a micro mirror array. This spatial light modulator receives control from the control and computation unit 86 such that the light field 811 can be reflected to various positions of the device under test 87 through the imaging lens set acting as the second light modulation unit 822.

Therefore, it is understood that the operational manner of the ninth embodiment of the thermal properties measurement system is similar to that of the eighth embodiment of the thermal properties measurement system. As such, detailed description on operation of the ninth embodiment of the thermal properties measurement system seems redundant.

The thermal properties measurement system, according to the ninth embodiment, uses a light field, which has a specific distribution of intensity after modulation, to illuminate on the device under test 87 so as to heat the device under test 87 by the illumination pattern, and to simulate a temperature distribution of the device under test 87 in a state of continuous operation. Besides, through the thermal signal capture units 84, 85, the thermal signal of the top surface 871 and the thermal signal of the bottom surface 872 of the device under test 87 can be captured. As such, the thermal properties measurement system, according to the ninth embodiment, does not need to actually light up the device under test 87 nor to apply any electric power to the device under test 87 (as the measurement manner adopted in the conventional thermal properties measurement system), the device under test 87 can be promptly measured for its various thermal property values, such as thermal resistance, heat capacity, thermal diffusion parameters, and so forth.

Figure 11:
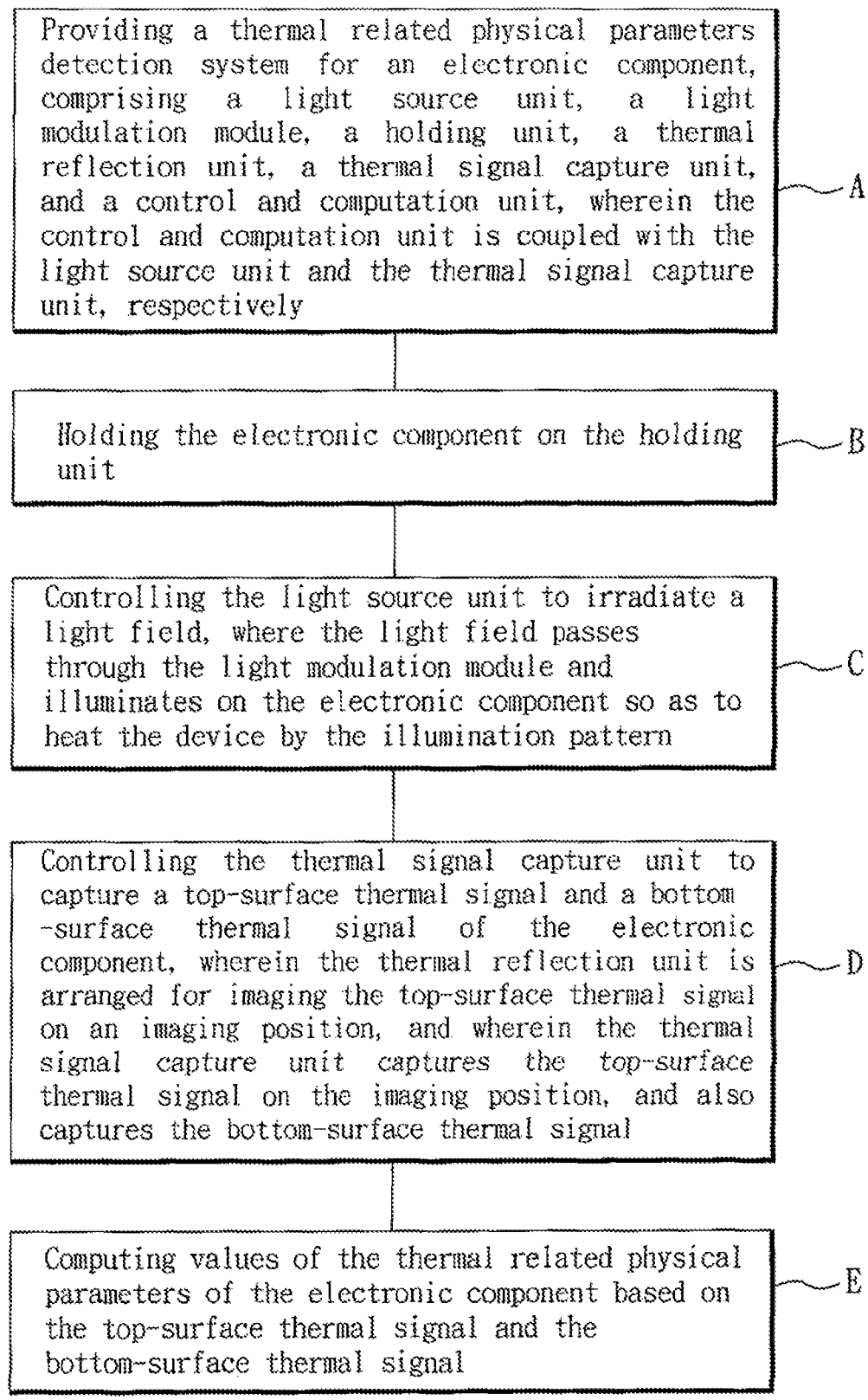
FIG. 11 is a flowchart illustrating a method for measuring highly adaptive thermal properties according to a tenth embodiment of the present invention.

Referring to FIG. 11, a flowchart illustrating a method for measuring highly adaptive thermal properties according to a tenth embodiment of the present invention, the measuring method comprises the following steps:

(A) Providing a highly adaptive thermal properties measurement system, comprising a light source unit, a light modulation module, a holding unit, a thermal reflection unit, a thermal signal capture unit, and a control and computation unit, wherein the control and computation unit is coupled with the light source unit and the thermal signal capture unit, respectively;

(B) Holding a device under test on the holding unit;

(C) Controlling the light source unit to irradiate a light field, where the light field passes through the light modulation unit and illuminates on the device under test so as to heat the device under test by the illumination pattern;

(D) Controlling the thermal signal capture unit to capture a top-surface thermal signal and a bottom-surface thermal signal of the device under test, wherein the thermal reflection unit is, arranged for imaging the top-surface thermal signal on an imaging position, and wherein the thermal signal capture unit captures the top-surface thermal signal on the imaging position, and also captures the bottom-surface thermal signal; and (E) Computing thermal property values of the device under test based on the top-surface thermal signal and the bottom-surface thermal signal.

In the thermal properties measurement system, as recited in step (A), the light modulation module is used to modulate the distribution of intensity of the light field, and that the thermal reflection unit is arranged toward the device under test.

The thermal properties measurement system, as involved in step (A) of the method for measuring highly adaptive thermal properties according to the tenth embodiment of the present invention, relates exactly to the thermal properties measurement system of the first embodiment of the present invention, as shown in FIG. 2A. The measurement system comprises a light source unit 21, a light modulation module 22, a holding unit 23, a thermal reflection unit 24, a thermal signal capture unit 25, and a control and computation unit 26.

According to the first embodiment of the present invention, the device under test 27 includes, but not limited to, an LED module, an LED module sub-mount, a CPU, a laser diode, a laser diode sub-mount, a power transistor, a solar cell chip, a solar panel, a cooling fin or other object for which measuring thermal properties is necessary. Further, the light source unit 21 relates to a high power laser, such as one provides a wavelength of, but not limited to, 976 nm. Besides, the output power of the high power laser may only be necessary to make the device under test 27 produce a measurable temperature variation, without any other limitation. Still further, the output of the high power laser may be of continuous wave or pulse so long as making the device under test 27 produce a measurable temperature variation.

In the first embodiment of the present invention, the light source unit 21 is used to provide a light field 211. Besides, the light modulation module 22 is used to modulate the distribution of intensity of the light field 211. The light modulation module 22 includes a first light modulation unit 221 and a second light modulation unit 222 such that light passes first through the first light modulation unit 221 and then through the second light modulation unit 222. Further, the first light modulation unit 221 relates to an aperture and the second light modulation unit 222 to a galvo scanner, where the first light modulation unit 221 and the second light modulation unit 222 are coupled to the control and computation unit 26 so as to be governed by the same, and to reflect the light field 211 to various positions of the device under test 27.

Further, in step (B) of the method according to the tenth embodiment of the present invention, to hold the device under test 27 on the holding unit as shown in FIG. 2A, the device under test 27 is held by the holding unit 23 such that the holding unit 23 holds a surface other than the top surface 271 and the bottom surface 272 of the device under test 27, such as a side surface. In the first embodiment, the holding unit 23 is constituted by general opto-mechanical components, and in order to avoid influencing thermal related behaviors of the device under test 27, such as cooling behavior, the contacting portion that the holding unit 23 contacts the device under test 27 is made of materials of "heat-insulation function," such as insulation foam, so as to prevent thermal energy of the device under test 27 dispersing from the holding unit 23 to the surrounding.

It is noted that, in order to improve the precision of the method for measuring thermal properties of the device under test according to the present embodiment, it is required to pre-measure, prior to performing step (B), various thermal property values of the holding unit 23, such as but limited to thermal resistance, heat capacity, and thermal diffusion parameters. As such, influence resulted from the property of the holding unit 23 itself (such as thermal property of material) can be removed from these thermal property values of the device under test 27 during subsequent step of computation (such as step (E)) for the thermal property values of the device under test.

Thereafter, to control the light source unit to irradiate a light field, where the light field passes through the light modulation unit and illuminates on the device under test so as to heat the device under test by the illumination pattern. At this moment, the control and computation unit 26 controls the light source unit 21 to irradiate a light field 211 (such as a power laser), where the light field 211 passes through an aperture acting as a first light modulation unit 221 and a galvo scanner acting as a second light modulation unit 222, and then illuminates on the device under test 27. Therefore, the galvo scanner receives control of the control and computation unit 26 so as to reflect the light field 211, in a pre-determined mode, to various positions at the top surface of the device under test 27, such as positions of multiple LED modules of an LED module sub-mount. Namely, the light field 211 performs a scanning on the device under test 27 in a specific mode (such as progressive scanning), so that the device under test 27 (such as an LED module sub-mount) can be heated under a pre-determined heating mode so as to simulate a temperature distribution of the device under test 27 in a state of continuous operation, such as the state when the multiple LED modules of an LED module sub-mount have run for a certain period of time.

Then in step (D), to control the thermal signal capture unit to capture a top-surface thermal signal and a bottom-surface image of the device under test, wherein the thermal reflection unit is arranged for imaging the top-surface thermal signal on an imaging position, and wherein the thermal signal capture unit captures the top-surface thermal signal on the imaging position, and also captures the bottom-surface image. As shown in FIG. 2A, the thermal reflection unit 24 is arranged toward the device under test 27 so as to image the top-surface thermal signal of the device under test 27 on an imaging position 241. In the first embodiment, the thermal reflection unit 24 relates to a concave mirror, and that the concave mirror is coated, on its reflective surface, with a heat reflective film 242. Preferably, the heat reflective film 242 is of a material of gold or silver so as to effectively image the thermal signal of the top surface of the device under test 27 on the imaging position 241.

At this moment, the control and computation unit 26 controls the thermal signal capture unit 25 to capture the thermal signal of the top surface of the device under test 27 from the imaging position 241 (see FIG. 2B), and to capture the thermal signal of the bottom surface 272 of the device under test 27 (see also FIG. 2C). In this embodiment, the thermal signal capture unit 25 relates to a thermal camera, a mid-wavelength infrared detector, or a long-wavelength infrared detector so as to capture the thermal signal of the top surface 271, and of the bottom surface 272, of the device under test 27, as respectively shown in FIG. 2B and FIG. 2C.

Eventually, in step (E), to compute thermal property values of the device under test based on the top-surface thermal signal and the bottom-surface image. The control and computation unit 26 relates to a computer including a display unit 261. Further, the control and computation unit 26, based on the top-surface temperature distribution of the device under test 27 corresponding to the top-surface thermal signal (as shown in FIG. 2B) and the bottom-surface temperature distribution of the device under test 27 corresponding to the bottom-surface thermal signal (as shown in FIG. 2C), computes multiple thermal property values of the device under test 27 such as thermal resistance, heat capacity, and thermal diffusion parameters. At this moment, the display unit 261 is employed to display the top-surface thermal signal, the bottom-surface thermal signal, and these thermal property values.

Therefore, the method for measuring highly adaptive thermal properties, according to the tenth embodiment of the present invention, relates to using a light field, which has a specific distribution of intensity after modulation, to illuminate on the device under test 27 so as to heat the device under test 27 by the illumination pattern, and to simulate a temperature distribution of the device under test 27 in a state of continuous operation. Besides, through the thermal signal capture unit, the thermal signal of the top surface 271 and the thermal signal of the bottom surface 272 of the device under test 27 can be captured. As such, the method for measuring highly adaptive thermal properties, according to the tenth embodiment of the present invention, does not need to actually light up the device under test nor to apply any electric power to the device under test (as the measurement manner adopted in the conventional thermal properties measurement system), the device under test 27 can be promptly measured for its various thermal property values, such as thermal resistance, heat capacity, and thermal diffusion parameters, and so forth.

Although the present invention has been explained in relation to its preferred embodiments, it is to be understood that many other possible modifications and variations can be made without departing from the scope of the invention as hereinafter claimed.

What is claimed is:

1. A highly adaptive thermal properties measurement system, provided for measuring plural thermal property values of a device under test having a top surface and a bottom surface, comprising:
    a light source unit, provided for supplying a light field;
    a light modulation module, provided for modulating distribution of intensity of the light field;
    a holding unit, provided for holding the device under test;
    a thermal reflection unit, being arranged toward the device under test;
    a thermal signal capture unit, provided for capturing a thermal signal of the top surface and a thermal signal of the bottom surface respectively; and
    a control and computation unit, provided for coupling with the light source unit and the thermal signal capture unit, respectively;
    wherein, the light field irradiates from the light source unit and passes through the light modulation unit and illuminates on the device under test so as to heat the device under test, and the thermal reflection unit is arranged for imaging the top-surface thermal signal on an imaging position, and wherein the thermal signal capture unit captures the top-surface thermal signal on the imaging position, and also captures the bottom-surface thermal signal, then the control and computation unit computes thermal property values of the device under test based on the top-surface thermal signal and the bottom-surface thermal signal.

2. The highly adaptive thermal properties measurement system as claimed in claim 1, wherein the light source unit relates to a high power laser.

3. The highly adaptive thermal properties measurement system as claimed in claim 1, wherein the light modulation module includes a first light modulation unit, a second light modulation unit, and a third light modulation unit such that light passes first through the first light modulation unit and then, in sequence, through the second light modulation unit and the third light modulation unit; and wherein the first light modulation unit relates to a spatial light modulator, the second light modulation unit to a galvo scanner, and the third light modulation unit to an imaging lens set, and the first light modulation unit and the second light modulation unit are coupled with the control and computation unit, respectively.

4. The highly adaptive thermal properties measurement system as claimed in claim 1, wherein the thermal reflection unit relates to a concave mirror, and the concave mirror is coated, on its reflective surface, with a heat reflective film.

5. The highly adaptive thermal properties measurement system as claimed in claim 1, wherein the thermal signal capture unit relates to a thermal camera, a mid-wavelength infrared detector, or a long-wavelength infrared detector.

6. The highly adaptive thermal properties measurement system as claimed in claim 1, wherein the control and computation unit relates to a computer having a display unit, and the control and computation unit, based on the temperature distribution of the top-surface of the device under test corresponding to the top-surface thermal signal and the temperature distribution of the bottom-surface of the device under test corresponding to the bottom-surface thermal signal, computes multiple thermal property values of the device under test, and the display unit is used for displaying the top-surface thermal signal, the bottom-surface thermal signal, and the thermal property values.

7. The highly adaptive thermal properties measurement system as claimed in claim 1, wherein the thermal property values of the device under test include thermal resistance, heat capacity, and thermal diffusion parameters.

8. The highly adaptive thermal properties measurement system as claimed in claim 1, wherein the top surface and the bottom surface of the device under test are coated with a graphite layer, respectively.

9. The highly adaptive thermal properties measurement system as claimed in claim 1, wherein the light modulation module includes a first light modulation unit and a second light modulation unit such that light passes first through the first light modulation unit and then through the second light modulation unit.

10. The highly adaptive thermal properties measurement system as claimed in claim 9, wherein the first light modulation unit relates to an aperture and the second light modulation unit to a galvo scanner such that the second light modulation unit is coupled with the control and computation unit.

11. The highly adaptive thermal properties measurement system as claimed in claim 9, wherein the first light modulation unit relates to an aperture and the second light modulation unit to an imaging lens set.

12. The highly adaptive thermal properties measurement system as claimed in claim 9, wherein the first light modulation unit relates to a spatial light modulator and the second light modulation unit to a galvo scanner such that the first light modulation unit and the second light modulation unit are coupled with the control and computation unit, respectively.

13. The highly adaptive thermal properties measurement system as claimed in claim 9, wherein the first light modulation unit relates to a spatial light modulator and the second light modulation unit to an imaging lens set such that the first light modulation unit is coupled with the control and computation unit.

14. The highly adaptive thermal properties measurement system as claimed in claim 9, wherein the first light modulation unit relates to a fiber bundle and the second light modulation unit to an imaging lens set.

15. The highly adaptive thermal properties measurement system as claimed in claim 14, wherein the light modulation module further includes a third light modulation unit such that light passes first through the first light modulation unit and then, in sequence, through the third light modulation unit and the second light modulation unit; and wherein the third light modulation unit relates to a spatial light modulator and is coupled with the control and computation unit.

16. A highly adaptive thermal properties measurement system, provided for measuring plural thermal property values of a device under test having a top surface and a bottom surface, comprising:
a light source unit, provided for supplying a light field;
a light modulation module, provided for modulating distribution of intensity of the light field;
a holding unit, provided for holding the device under test;
a first thermal signal capture unit, arranged toward the device under test for capturing a bottom-surface of the thermal signal;
a second thermal signal capture unit, arranged at one side of the holding unit opposite to the first thermal signal capture unit so as to capture a top-surface thermal signal of the device under test; and
a control and computation unit, coupled with the light source unit, the first thermal signal capture unit, and the second thermal signal capture unit;
wherein, the light field irradiates from the light source unit and passes through the light modulation unit and illuminates on the device under test so as to heat the device under test, then the control and computation unit computes thermal property values of the device under test based on the top-surface thermal signal and the bottom-surface thermal signal.

17. The highly adaptive thermal properties measurement system as claimed in claim 16, wherein the light source unit relates to a high power laser.

18. The highly adaptive thermal properties measurement system as claimed in claim 16, wherein the first thermal signal capture unit and the second thermal signal capture unit relate to a thermal camera, a mid-wavelength infrared detector, or a long-wavelength infrared detector, respectively.

19. The highly adaptive thermal properties measurement system as claimed in claim 16, wherein the control and computation unit relates to a computer having a display unit, and the control and computation unit, based on the temperature distribution of the top-surface of the device under test corresponding to the top-surface thermal signal and the temperature distribution of the bottom-surface of the device under test corresponding to the bottom-surface thermal signal, computes multiple thermal property values of the device under test, and the display unit is used for displaying the top-surface thermal signal, the bottom-surface thermal signal, and the thermal property values.

20. The highly adaptive thermal properties measurement system as claimed in claim 16, wherein the light modulation module includes a first light modulation unit and a second light modulation unit such that light passes first through the first light modulation unit and then through the second light modulation unit.

21. The highly adaptive thermal properties measurement system as claimed in claim 20, wherein the first light modulation unit relates to an aperture and the second light modulation unit to an imaging lens set.

22. The cooling structure for transmission as claimed in claim 20, wherein the first light modulation unit relates to a spatial light modulator and the second light modulation unit to an imaging set such that the first light modulation unit is coupled with the control and computation unit.

23. A method for measuring highly adaptive thermal properties, provided for measuring plural thermal property values of a device under test having a top surface and a bottom surface, comprising the following steps:

(A) Providing a highly adaptive thermal properties measurement system, comprising a light source unit, a light modulation module, a holding unit, a thermal reflection unit, a thermal signal capture unit, and a control and computation unit, wherein the control and computation unit is coupled with the light source unit and the thermal signal capture unit, respectively;
(B) Holding the device under test on the holding unit;
(C) Controlling the light source unit to irradiate a light field, where the light field passes through the light modulation module and illuminates on the device under test so as to heat the device under test;
(D) Controlling the thermal signal capture unit to capture a top-surface thermal signal and a bottom-surface thermal signal of the device under test, wherein the thermal reflection unit is arranged for imaging the top-surface thermal signal on an imaging position, and wherein the thermal signal capture unit captures the top-surface thermal signal on the imaging position, and also captures the bottom-surface thermal signal; and
(E) Computing thermal property values of the device under test based on the top-surface thermal signal and the bottom-surface thermal signal;
wherein, in the highly adaptive thermal properties measurement system, the light modulation module is used to modulate the distribution of intensity of the light field, and the thermal reflection unit is arranged toward the device under test.

24. The method for measuring highly adaptive thermal properties as claimed in claim 23, wherein the thermal reflection unit relates to a concave mirror, and the concave mirror is coated, on its reflective surface, with a heat reflective film; and wherein the thermal signal capture unit relates to a thermal camera, a mid-wavelength infrared detector, or a long-wavelength infrared detector.

25. The method for measuring highly adaptive thermal properties as claimed in claim 23, wherein the control and computation unit relates to a computer having a display unit, and the control and computation unit, based on the temperature distribution of the top-surface of the device under test corresponding to the top-surface thermal signal and the temperature distribution of the bottom-surface of the device under test corresponding to the bottom-surface thermal signal, computes multiple thermal property values of the device under test, and the display unit is used for displaying the top-surface thermal signal, the bottom-surface thermal signal, and the thermal property values.

26. The method for measuring highly adaptive thermal properties as claimed in claim 23, wherein the thermal property values of the device under test include thermal resistance, heat capacity, and thermal diffusion parameters.

27. The method for measuring highly adaptive thermal properties as claimed in claim 23, wherein the light source unit relates to a high power laser and the light modulation module includes a first light modulation unit and a second light modulation unit such that light passes first through the first light modulation unit and then through the second light modulation unit.

28. The method for measuring highly adaptive thermal properties as claimed in claim 27, wherein the first light modulation unit relates to an aperture and the second light modulation unit to a galvo scanner such that the second light modulation unit is coupled with the control and computation unit.

* * * * *